United States Patent
Coakley et al.

(10) Patent No.: US 12,052,814 B2
(45) Date of Patent: Jul. 30, 2024

(54) FLEXIBLE HYBRID INTERCONNECT CIRCUITS

(71) Applicant: CelLink Corporation, San Carlos, CA (US)

(72) Inventors: Kevin Michael Coakley, Belmont, CA (US); Malcom Parker Brown, Mountain View, CA (US); Jose Juarez, Mountain View, CA (US); Emily Hernandez, Belmont, CA (US); Joseph Pratt, Sunnyvale, CA (US); Peter Stone, Los Gatos, CA (US); Vidya Viswanath, Sunnyvale, CA (US); Will Findlay, San Carlos, CA (US)

(73) Assignee: CelLink Corporation, San Carlos, CA (US)

( * ) Notice: Subject to any disclaimer, the term of this patent is extended or adjusted under 35 U.S.C. 154(b) by 93 days.

(21) Appl. No.: 18/051,289

(22) Filed: Oct. 31, 2022

(65) Prior Publication Data
US 2023/0116550 A1  Apr. 13, 2023

Related U.S. Application Data

(63) Continuation of application No. 17/455,386, filed on Nov. 17, 2021, now Pat. No. 11,516,904, which is a
(Continued)

(51) Int. Cl.
*H05K 1/02* (2006.01)
*H01B 7/08* (2006.01)
(Continued)

(52) U.S. Cl.
CPC .......... *H05K 1/0219* (2013.01); *H01B 11/00* (2013.01); *H05K 1/0237* (2013.01); *H05K 1/028* (2013.01);
(Continued)

(58) Field of Classification Search
CPC ................. H05K 1/0219; H05K 1/028; H05K 2201/0145; H05K 1/0393; H01B 7/0838
See application file for complete search history.

(56) References Cited

U.S. PATENT DOCUMENTS 3,750,278 A   8/1973  Oberg et al.
4,818,840 A   4/1989  Booth et al.
(Continued)

FOREIGN PATENT DOCUMENTS

CN   1119903 A   4/1996
CN   1247635 A   3/2000
(Continued)

OTHER PUBLICATIONS

Chinese Application Serial No. 2019-80086778X, First Office Action dated Jan. 9, 2024, 10 pgs.
(Continued)

*Primary Examiner* — Sherman Ng
(74) *Attorney, Agent, or Firm* — Polygon IP, LLP

(57) ABSTRACT

Provided are flexible hybrid interconnect circuits and methods of forming thereof. A flexible hybrid interconnect circuit comprises multiple conductive layers, stacked and spaced apart along the thickness of the circuit. Each conductive layer comprises one or more conductive elements, one of which is operable as a high frequency (HF) signal line. Other conductive elements, in the same and other conductive layers, form an electromagnetic shield around the HF signal line. Some conductive elements in the same circuit are used for electrical power transmission. All conductive elements are supported by one or more inner dielectric layers and enclosed by outer dielectric layers. The overall stack is thin and flexible and may be conformally attached to a non-planar surface. Each conductive layer may be formed by patterning the same metallic sheet. Multiple pattern sheets
(Continued)

are laminated together with inner and outer dielectric layers to form a flexible hybrid interconnect circuit.

19 Claims, 32 Drawing Sheets

Related U.S. Application Data continuation of application No. 16/950,155, filed on Nov. 17, 2020, now Pat. No. 11,206,730, which is a continuation of application No. 16/850,340, filed on Apr. 16, 2020, now Pat. No. 10,874,015, which is a continuation of application No. 16/667,133, filed on Oct. 29, 2019, now Pat. No. 10,694,618.

(60) Provisional application No. 62/752,019, filed on Oct. 29, 2018.

(51) Int. Cl.
    *H01B 11/00*     (2006.01)
    *H05K 1/03*     (2006.01)

(52) U.S. Cl.
    CPC ... *H05K 1/0326* (2013.01); *H05K 2201/0145* (2013.01)

(56) References Cited

U.S. PATENT DOCUMENTS

| | | | |
|---|---|---|---|
| 5,003,273 A | 3/1991 | Oppenberg | |
| 5,227,588 A | 7/1993 | Schreiber et al. | |
| 5,262,594 A | 11/1993 | Edwin et al. | |
| 5,645,932 A | 7/1997 | Uchibori | |
| 5,675,299 A | 10/1997 | Suski | |
| 6,010,771 A | 1/2000 | Isen et al. | |
| 6,036,809 A | 3/2000 | Kelly et al. | |
| 6,332,909 B1 | 12/2001 | Teshima et al. | |
| 6,787,732 B1 | 9/2004 | Xuan et al. | |
| 6,881,923 B2 | 4/2005 | Battaglia | |
| 6,992,001 B1 | 1/2006 | Lin | |
| 7,497,004 B2 | 3/2009 | Cote et al. | |
| 7,633,035 B2 | 12/2009 | Kirmeier | |
| 8,510,934 B2 | 8/2013 | Brand et al. | |
| 8,931,166 B2 | 1/2015 | Marttila | |
| 8,975,510 B2 | 3/2015 | Coakley | |
| 9,147,875 B1 | 9/2015 | Coakley et al. | |
| 9,214,607 B1 | 12/2015 | Andrews | |
| 9,402,303 B2 | 7/2016 | Qian et al. | |
| 9,466,777 B2 | 10/2016 | Coakley et al. | |
| 9,671,352 B2 | 6/2017 | Woo et al. | |
| 9,692,030 B2 | 6/2017 | Schüssler et al. | |
| 9,730,333 B2 | 8/2017 | Li et al. | |
| 10,008,403 B2 | 6/2018 | Rumsby | |
| 10,153,570 B2 | 12/2018 | Coakley et al. | |
| 10,211,443 B2 | 2/2019 | Coakley et al. | |
| 10,299,375 B2 | 5/2019 | Kim et al. | |
| 10,383,207 B2 | 8/2019 | Coakley et al. | |
| 10,694,618 B2 | 6/2020 | Coakley et al. | |
| 10,842,025 B1 | 11/2020 | Lane | |
| 10,874,015 B2 | 12/2020 | Coakley et al. | |
| 11,206,730 B2 | 12/2021 | Coakley et al. | |
| 11,516,904 B2 | 11/2022 | Coakley et al. | |
| 2001/0006766 A1 | 7/2001 | O'brien et al. | |
| 2002/0046856 A1 | 4/2002 | Alcoe | |
| 2002/0050489 A1 | 5/2002 | Ikegami et al. | |
| 2003/0062347 A1 | 4/2003 | Song et al. | |
| 2005/0150686 A1* | 7/2005 | Powell | H05K 3/4617 174/262 |
| 2006/0032665 A1 | 2/2006 | Ice | |
| 2006/0264092 A1 | 11/2006 | Kumakura et al. | |
| 2007/0171129 A1 | 7/2007 | Coleman et al. | |
| 2007/0193027 A1 | 8/2007 | Takakusaki et al. | |
| 2008/0017971 A1 | 1/2008 | Hollis | |
| 2008/0078573 A1 | 4/2008 | Hu et al. | |
| 2008/0083715 A1 | 4/2008 | Kirmeier | |
| 2008/0128397 A1 | 6/2008 | Gandhi | |
| 2009/0000804 A1 | 1/2009 | Kobayashi et al. | |
| 2009/0007421 A1 | 1/2009 | Chen et al. | |
| 2010/0031996 A1 | 2/2010 | Basol | |
| 2011/0001670 A1 | 1/2011 | Coleman et al. | |
| 2011/0089212 A1 | 4/2011 | Schmid et al. | |
| 2011/0121922 A1 | 5/2011 | Blair et al. | |
| 2012/0164490 A1 | 6/2012 | Itoi et al. | |
| 2012/0171527 A1 | 7/2012 | Hiroma | |
| 2012/0227907 A1 | 9/2012 | Arakawa et al. | |
| 2013/0055555 A1 | 3/2013 | Forster et al. | |
| 2013/0260191 A1 | 10/2013 | Takahashi et al. | |
| 2014/0097021 A1 | 4/2014 | Su | |
| 2014/0102763 A1 | 4/2014 | Lin | |
| 2014/0268780 A1 | 9/2014 | Wang et al. | |
| 2015/0023584 A1 | 1/2015 | Rudin et al. | |
| 2015/0228956 A1 | 8/2015 | Schüssler et al. | |
| 2015/0270190 A1 | 9/2015 | Kim et al. | |
| 2016/0120021 A1 | 4/2016 | Iida | |
| 2016/0181579 A1 | 6/2016 | Geshi et al. | |
| 2016/0207287 A1 | 7/2016 | Kim | |
| 2016/0315304 A1 | 10/2016 | Biskup | |
| 2016/0366768 A1 | 12/2016 | Matsuda et al. | |
| 2017/0012331 A1 | 1/2017 | Ng et al. | |
| 2017/0214033 A1 | 7/2017 | Takano et al. | |
| 2018/0034023 A1 | 2/2018 | Newman et al. | |
| 2018/0205048 A1 | 7/2018 | Enomoto et al. | |
| 2018/0294536 A1 | 10/2018 | Kruszelnicki | |
| 2019/0021161 A1 | 1/2019 | Coakley et al. | |
| 2019/0097204 A1 | 3/2019 | Liposky et al. | |
| 2019/0181419 A1 | 6/2019 | Suba et al. | |
| 2019/0218142 A1 | 7/2019 | Logunov et al. | |
| 2019/0296281 A1 | 9/2019 | Elsberry | |
| 2019/0312251 A1 | 10/2019 | Matthews | |
| 2019/0341585 A1 | 11/2019 | Shi et al. | |
| 2020/0021019 A1 | 1/2020 | Rajagopalan et al. | |
| 2020/0137882 A1 | 4/2020 | Coakley et al. | |
| 2020/0220120 A1 | 7/2020 | Day et al. | |
| 2020/0245449 A1 | 7/2020 | Coakley et al. | |
| 2021/0066683 A1 | 3/2021 | Lane | |
| 2021/0076485 A1 | 3/2021 | Coakley et al. | |
| 2021/0086306 A1 | 3/2021 | Lane | |
| 2021/0091363 A1 | 3/2021 | Lane | |
| 2021/0092853 A1 | 3/2021 | Lane | |
| 2021/0092854 A1 | 4/2021 | Lane | |
| 2021/0092837 A1 | 6/2021 | Lane | |
| 2021/0092851 A1 | 6/2021 | Lane | |

FOREIGN PATENT DOCUMENTS

| | | |
|---|---|---|
| CN | 1761056 A | 4/2006 |
| CN | 201898663 U | 7/2011 |
| CN | 102479724 A | 5/2012 |
| CN | 101983003 B | 4/2014 |
| CN | 203715762 U | 7/2014 |
| CN | 104302103 A | 1/2015 |
| CN | 104582246 A | 4/2015 |
| CN | 113228831 A | 8/2021 |
| CN | 113228831 A | 8/2021 |
| CN | 114128052 A | 3/2022 |
| CN | 116897463 A | 10/2023 |
| EP | 1085792 B1 | 12/2008 |
| EP | 3496180 A1 | 6/2019 |
| EP | 3868184 A2 | 8/2021 |
| EP | 3868184 A4 | 8/2022 |
| JP | H08106818 A | 4/1996 |
| JP | 2004063082 A | 2/2004 |
| JP | 2012084434 A | 4/2012 |
| KR | 20150058939 A | 5/2015 |
| WO | 2019150740 A1 | 8/2019 |
| WO | 2020092334 A2 | 5/2020 |

OTHER PUBLICATIONS

Nagarajan Palavesam et al; "Roll-to-roll processing of film substrates for hybrid integrated flexible electronics" Flexible and Printed Electronics, Feb. 2018.

(56) References Cited

OTHER PUBLICATIONS

U.S. Appl. No. 16/850,340, Notice Of Allowance dated Aug. 18, 2020, 12 pgs.
U.S. Appl. No. 16/950,155, Examiner Interview Summary dated Aug. 18, 2021, 1 pg.
U.S. Appl. No. 16/950,155, Notice of Allowance dated Aug. 18, 2021, 12 pgs.
U.S. Appl. No. 17/455,386, Examiner Interview Summary dated Oct. 19, 2022, 1 pg.
U.S. Appl. No. 17/455,386, Notice of Allowance dated Oct. 19, 2022, 15 pgs.
European Application Serial No. 19877997.7, Search Report dated Jul. 7, 2022, 8 pgs.
International Application Serial No. PCT/US19/58516, Preliminary Report on Patentability dated May 14, 2021, 7 pgs.
International Application Serial No. PCT/US2019/058516, Search Report and Written Opinion dated Apr. 27, 2010.

* cited by examiner

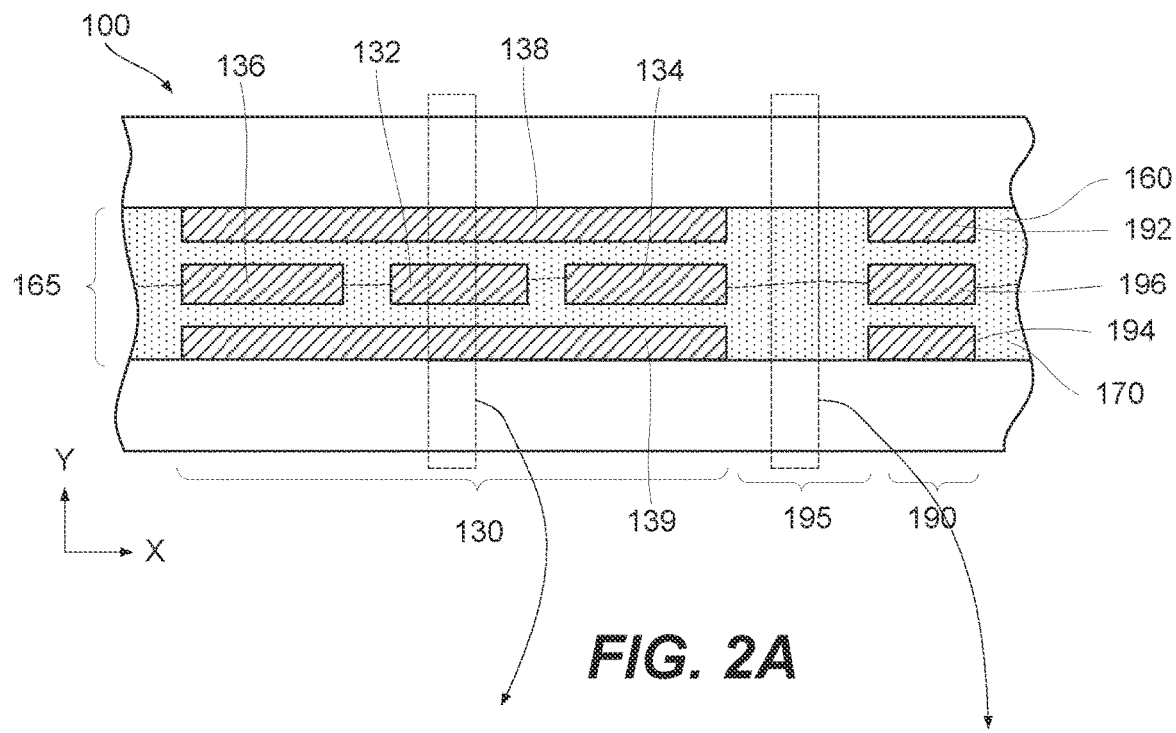
FIG. 2A
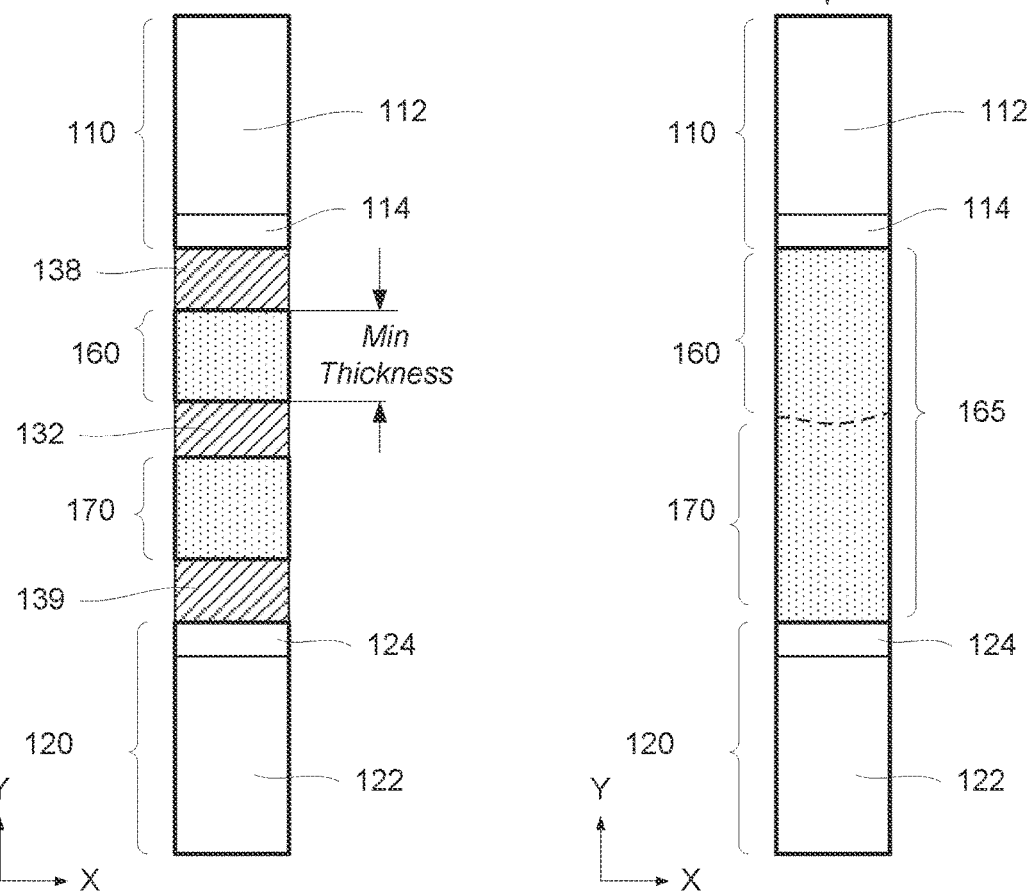
FIG. 2B
FIG. 2C

Opening is smaller that the wavelength in the signal line / and other signals nearby (no cross-talk)

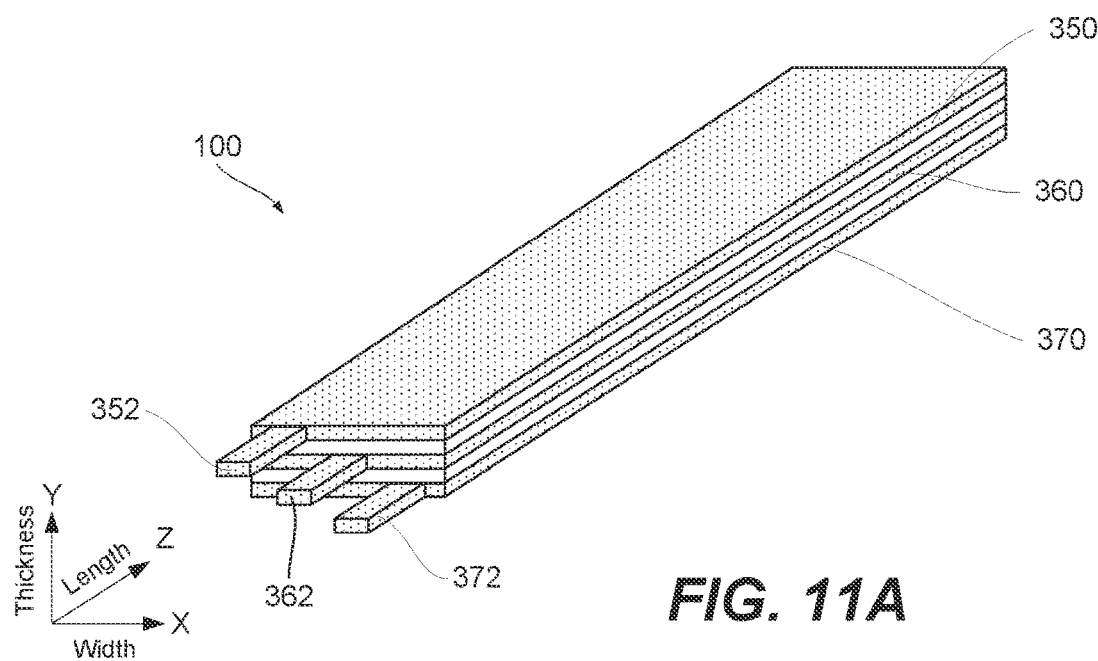
*FIG. 11A*
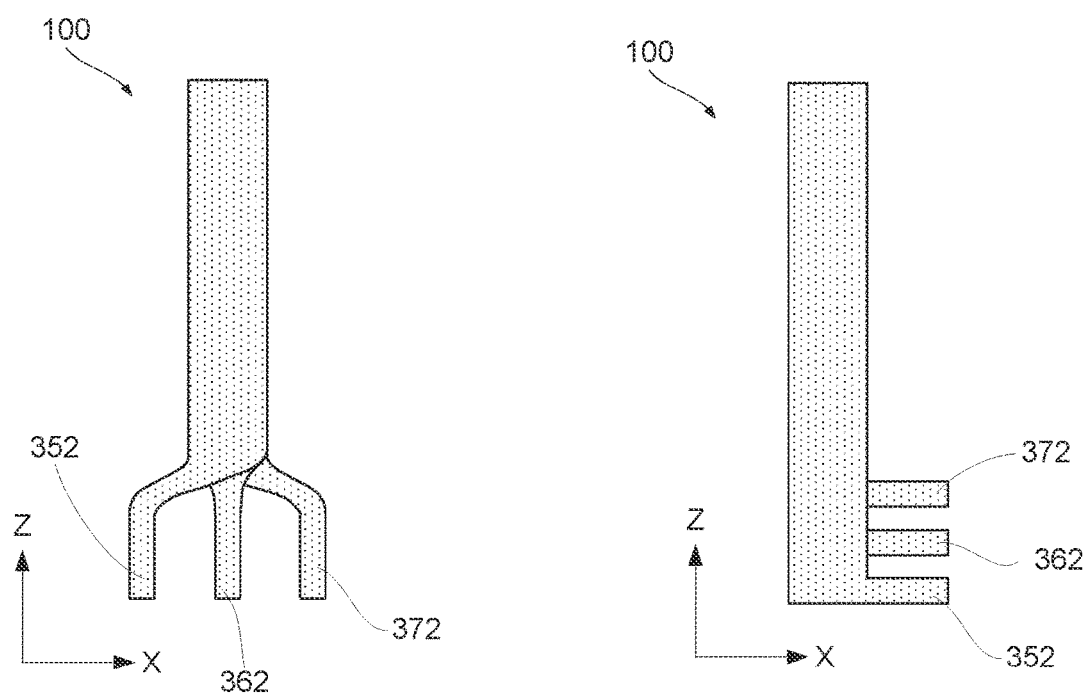
*FIG. 11B*
*FIG. 11C*

FLEXIBLE HYBRID INTERCONNECT CIRCUITS

CROSS-REFERENCE TO RELATED APPLICATIONS

This application is a continuation U.S. patent application Ser. No. 17/455,386, filed on 2021 Nov. 17, which is a continuation of U.S. patent application Ser. No. 16/950,155, filed on 2020 Nov. 17 and granted as U.S. Pat. No. 11,206,730 on 2021 Dec. 21, which is a continuation of U.S. patent application Ser. No. 16/850,340, filed on 2020 Apr. 16 and granted as U.S. Pat. No. 10,874,015 on 2020 Dec. 22, which is a continuation of U.S. patent application Ser. No. 16/667,133, filed on 2019 Oct. 29 and granted as U.S. Pat. No. 10,694,618 on 2020 Jun. 23, which claims the benefit under 35 U.S.C. § 119(e) of U.S. Provisional Patent Application No. 62/752,019, filed on 2018 Oct. 29, all of which are incorporated herein by reference in their entirety for all purposes.

BACKGROUND

Interconnect circuits are used to transmit electrical power and/or signals from one location to another. Some application examples include, but are not limited to, battery packs (e.g., interconnecting individual batteries), solar arrays (e.g., interconnecting individual cells in a solar panel), vehicles (e.g., wire harnesses), light fixtures (e.g., connecting multiple light-emitting diodes), various types of electrical and electronic circuits, and the like. While conventional interconnect circuits can transmit signals, these signals are often limited to direct current signals or low-frequency signals. The transmission of high frequency (HF) alternative current signals presents various challenges. For example, HF signal transmission requires precise impedance control of signal lines. Furthermore, HF signal transmission may cause electromagnetic interference and crosstalk, which is not desirable. Various conductors and dielectrics surrounding signal lines may absorb HF signals, which is also undesirable and often requires separate circuits, one for electrical power transmission and another one for signal transmission.

What is needed are flexible hybrid interconnect circuits capable of transmitting HF signals and electrical power in the same circuits.

SUMMARY

Provided are flexible hybrid interconnect circuits and methods of forming thereof. A flexible hybrid interconnect circuit comprises multiple conductive layers, stacked and spaced apart along the thickness of the circuit. Each conductive layer comprises one or more conductive elements, one of which is operable as an HF signal line. Other conductive elements, in the same and other conductive layers, form an electromagnetic shield around the HF signal line. Some conductive elements in the same circuit are used for electrical power transmission. All conductive elements are supported by one or more inner dielectric layers and enclosed by outer dielectric layers. The overall stack is thin and flexible and may be conformally attached to a non-planar surface. Each conductive layer may be formed by patterning the same metallic sheet. Multiple pattern sheets are laminated together with inner and outer dielectric layers to form a flexible hybrid interconnect circuit.

These and other examples are described further below with reference to the figures.

BRIEF DESCRIPTION OF THE DRAWINGS

FIG. 2A is a schematic cross-sectional view of a signal transmission portion, separation portion, and power transmission portion of the flexible hybrid interconnect circuit in FIG. 1A, in accordance with some examples.

FIG. 2B is an expanded cross-sectional view of an example of the signal transmission portion in FIG. 2A.

FIG. 2C is an expanded cross-sectional view of the separation portion in FIG. 2A, in accordance with some examples.

FIG. 11A-FIG. 11D illustrate examples of various tabs connected to conductive elements, which form a stack in a flexible hybrid interconnect circuit, with the tabs extending away from that stack.

DETAILED DESCRIPTION

Figure 1A:
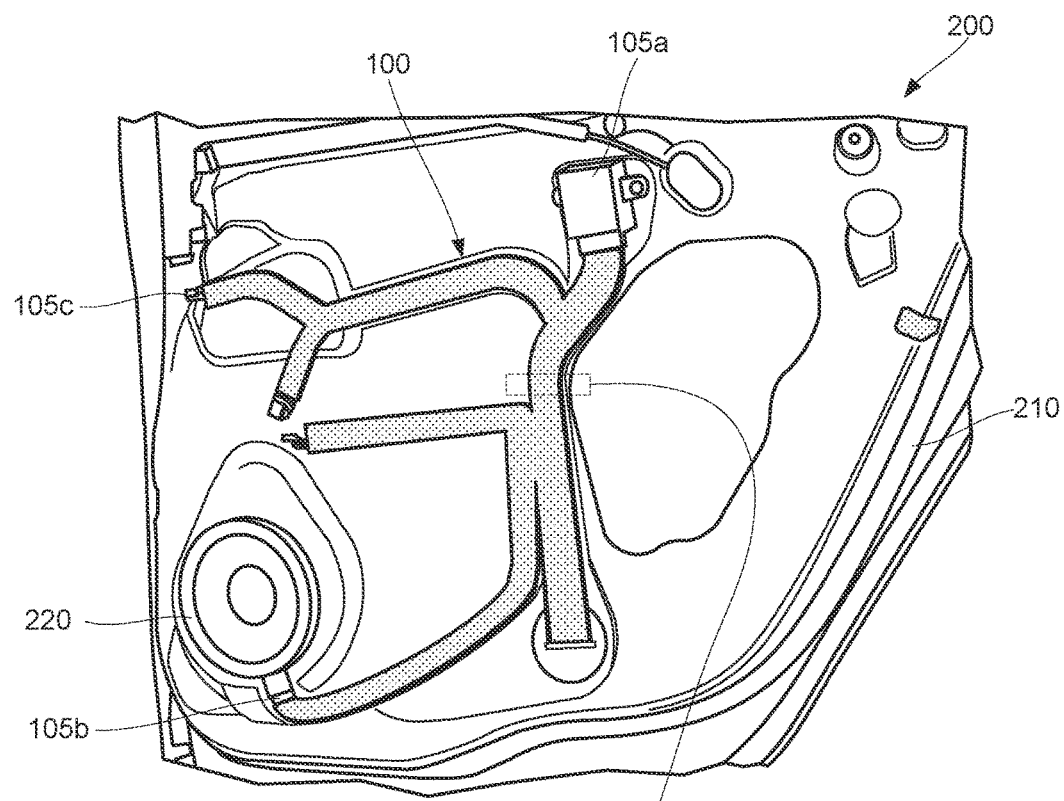
FIG. 1A is a schematic illustration of an assembly, comprising a flexible hybrid interconnect circuit, operable as a harness, in accordance with some examples.

In the following description, numerous specific details are set forth in order to provide a thorough understanding of the presented concepts. The presented concepts may be practiced without some or all of these specific details. In other instances, well-known process operations have not been described in detail so as to not unnecessarily obscure the described concepts. While some concepts will be described in conjunction with the specific examples, it will be understood that these examples are not intended to be limiting. On the contrary, it is intended to cover alternatives, modifications, and equivalents as may be included within the spirit and scope of the present disclosure as defined by the appended claims.

Introduction/Application Examples

Interconnect circuits are used to deliver power and/or signals between different parts of the circuits. These circuits may be used for various applications, such as vehicles, appliances, electronics, and the like. One example of such interconnect circuits is a harness, which typically utilizes electrical conductors having round cross-sectional profiles. In a conventional harness, each electrical conductor may be a solid round wire or a stranded set of small round wires. A polymer shell insulates each individual conductor. Furthermore, multiple insulated conductors may form a large bundle.

Unfortunately, these conventional harnesses are heavy and can be hard to feed through narrow spaces because of their substantial thicknesses caused by individual conductors and bundling these conductors. Furthermore, individual electrical conductors have poor thermal connections to the environment because of their geometries (round cross-sectional profiles) and arrangements (bundling). In particular, the round cross-sectional profile has the smallest perimeter-to-area ratio among all possible shapes. As a result, conventional harnesses experience poor heat dissipation during their operation and require wires with large cross-sections, all of which add to the weight, size, and cost of these harnesses. Finally, round wires are generally not capable of transmitting HF signals without expensive shielding materials.

These deficiencies of conventional harnesses and other like circuits are addressed with flexible hybrid interconnect circuits, described herein. A flexible hybrid interconnect comprises two outer dielectrics and a signal transmission portion, disposed between the outer dielectrics. The signal transmission portion is formed by multiple conductive elements, one of which is operable as a signal line. The signal line may be disposed between two or more shields, at least two of which are offset relative to the signal line along the width of the flexible hybrid interconnect circuit. Furthermore, additional shields may be used (e.g., the signal line may be disposed between two other shields, offset relative to the signal line along the width of the flexible hybrid interconnect circuit). All of these conductive elements are supported with respect to each other by one or more inner dielectrics and, in some example, by outer dielectrics, which also seal the conductive elements from the environment.

In some examples, the flexible hybrid interconnect circuit also comprises a power transmission portion. The power transmission portion may be offset relative to the signal transmission portion along the width of the flexible hybrid interconnect circuit to reduce electromagnetic interference. The number of conductive layers in the power transmission portion is the same as the number of conductive layers in the signal transmission portion.

Unlike conventional wire harnesses, the flexible hybrid interconnect circuit has a low thickness profile, which is determined by the thickness of all conductive layers as well as inner and outer dielectrics. Furthermore, the thickness of the flexible hybrid interconnect circuit is constant. In some examples, the thickness of the flexible hybrid interconnect circuit is less than five millimeters or even less than one millimeter, which is substantially smaller than the thickness of a conventional bundled harness. Such a small thickness is achieved by using thin conductive elements. The conductivity (e.g., in the power transmission portion) is achieved by using wide conductive elements. Furthermore, a combination of the small thickness and large width allows achieving good thermal contact with the environment (e.g., when the flexible hybrid interconnect circuit is adhered to and conforms to a heat sink, such as a vehicle body panel). This thickness-width feature allows stacking multiple conductive elements in two directions (the thickness direction and the width direction).

In some examples, the aspect ratio (the ratio of the width to the thickness) of the flexible hybrid interconnect circuit is more than three or even more than ten. In other words, the flexible hybrid interconnect circuit may have a thin and flat cross-sectional profile (i.e., within the cross-sectional plane perpendicular to the length of the flexible hybrid interconnect circuit). This aspect allows maintaining flexibility and conforming the flexible hybrid interconnect circuit to various non-planar surfaces while also providing thermal coupling to these surfaces. In some examples, one of the outer dielectrics comprises an adhesive layer for attaching to supporting structures, which may also be operable as heat sinks or heat spreaders.

FIG. 1A is a schematic illustration of assembly 200, comprising flexible hybrid interconnect circuit 100 attached to body panel 210. While body panel 210 is shown as a car door, one having ordinary skill in the art would understand that various other types of vehicle panels (e.g., roof) and types of vehicles (e.g., aircraft, watercraft) are also within the scope. Furthermore, flexible hybrid interconnect circuit 100 may be a part of or attached to other types of structures, such as battery housing, appliances (e.g., refrigerators, washers/dryers, heating, ventilation, and air conditioning), aircraft wiring, and the like. It should be noted that body panel 210 may be operable as a heat sink or heat spreader.

Returning to the example shown in FIG. 1A, flexible hybrid interconnect circuit 100 may be adhered to and supported by body panel 210. For example, flexible hybrid interconnect circuit 100 may comprise an adhesive (e.g., a thermally conductive adhesive) for attaching to body panel 210, as further described below. The flexibility of flexible hybrid interconnect circuit 100 is achieved by its small thickness and large aspect ratio. This flexibility allows flexible hybrid interconnect circuit 100 to conform and adhere to various non-planar portions of body panel 210. Maximizing the contact interface between flexible hybrid interconnect circuit 100 and body panel 210 provides greater support and more heat dissipation from flexible hybrid interconnect circuit 100 to body panel 210. The attachment between flexible hybrid interconnect circuit 100 and body panel 210 is further illustrated in FIG. 1B and described below. In addition to functioning as a thermal mass/heat spreader for flexible hybrid interconnect circuit 100, body panel 210 may provide electromagnetic shielding (e.g., when body panel 210 is metal and positioned sufficiently close to the signal line of flexible hybrid interconnect circuit 100).

Referring to FIG. 1A, in some examples, flexible hybrid interconnect circuit 100 comprises one or more connectors 105a-105c for connecting to various electrical devices 220. Some examples of electrical devices 220 include, but are not limited to, speakers, lights, door locks, window regulators, power mirrors, and the like. In some examples, flexible hybrid interconnect circuit 100 comprises conventional printed circuit structures used for transmitting data, including but not limited to, striplines, microstrips, and/or coplanar waveguides.

Examples of Flexible Hybrid Interconnect Circuits

Figure 1B:
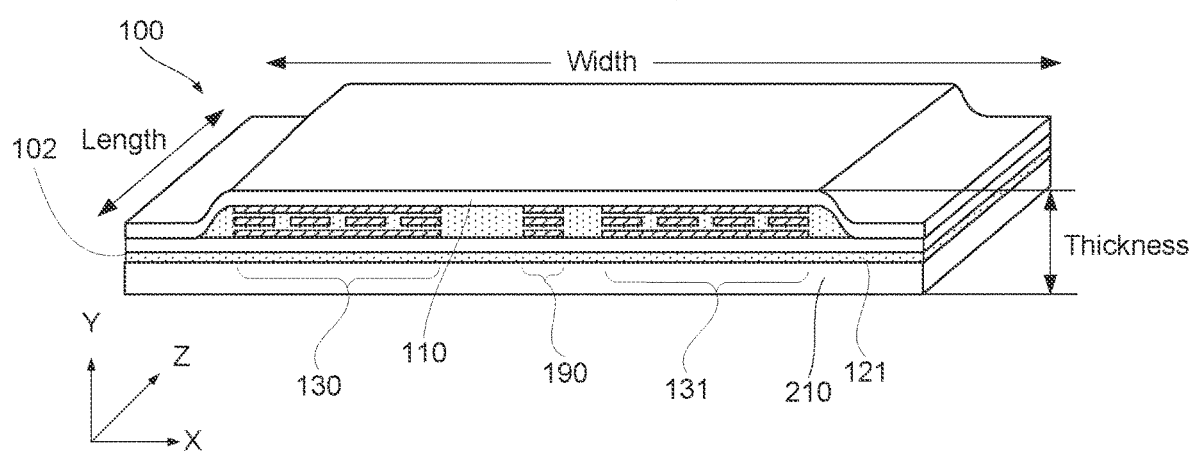
FIG. 1B is a schematic cross-sectional view of the flexible hybrid interconnect circuit in FIG. 1A, in accordance with some examples.

FIG. 1B is a schematic cross-sectional view of flexible hybrid interconnect circuit 100 in FIG. 1A and identifies, in general, the width (extending along the X-axis), thickness (along the Y-axis), and length (along Z-axis). One having ordinary skill in the art would understand that flexible hybrid interconnect circuit 100 will change its orientation due to its flexibility. Specifically, flexible hybrid interconnect circuit 100 may bend around any one of the identified axes during its production, handling, installation, and/or operation, and the orientation of the width, thickness, and length may change and may be different at different locations of flexible hybrid interconnect circuit 100.

Referring to FIG. 1B, flexible hybrid interconnect circuit 100 comprises first outer dielectric 110 and second outer dielectric 120, which collectively seal various internal components of flexible hybrid interconnect circuit 100. Furthermore, FIG. 1B illustrates flexible hybrid interconnect circuit 100 comprising signal transmission portion 130 and power transmission portion 190. In some examples, power transmission portion 190 is absent. Signal transmission portion 130 and power transmission portion 190 are disposed between first outer dielectric 110 and second outer dielectric 120. Together with other components of flexible hybrid interconnect circuit 100, such as inner dielectrics further described below, first outer dielectric 110 and second outer dielectric 120 also support conductive elements of signal transmission portion 130 and power transmission portion 190.

In some examples, flexible hybrid interconnect circuit 100 has multiple signal transmission portions, such as signal transmission portion 130 and additional signal transmission portion 131 shown in FIG. 1B. Multiple signal transmission portions are offset relative to each other along the width of flexible hybrid interconnect circuit 100. FIG. 1B illustrates an example in which signal transmission portion 130 and additional signal transmission portion 131 are separated by power transmission portion 190.

When power transmission portion 190 is present, power transmission portion 190 is offset relative to signal transmission portion 130 along the width of flexible hybrid interconnect circuit 100 (the X direction in FIG. 1B). Similar to signal transmission portion 130, power transmission portion 190 may comprise multiple conductive elements arranged into conductive layers. In some examples, the number of conductive layers in signal transmission portion 130 is the same as in power transmission portion 190, e.g., three conductive layers, as shown in FIG. 1B, forming a stack along the thickness. Alternatively, different numbers of conductive layers may be used. For example, conductive elements in power transmission portion 190 do not require electromagnetic shielding. As a result, power transmission portion 190 may have fewer conductive layers (e.g., one or two). In some examples, signal transmission portion 130 requires only one sided shielding, and only two conductive layers are used to form all conductive elements of signal transmission portion 130. Additional shielding may be provided, for example, by an external structure, such as body panel 210 in FIG. 1B.

Flexible hybrid interconnect circuit 100 may be attached to body panel 210 (or any other like supporting structure or heat sink) using adhesive layer 121 or, more specifically, a thermally conductive adhesive layer. It should be noted that while adhesive layer 121 is a part flexible hybrid interconnect circuit 100, body panel 210 (or any other like supporting structure or a heat sink) is not be a part of flexible hybrid interconnect circuit 100.

Figure 1C:
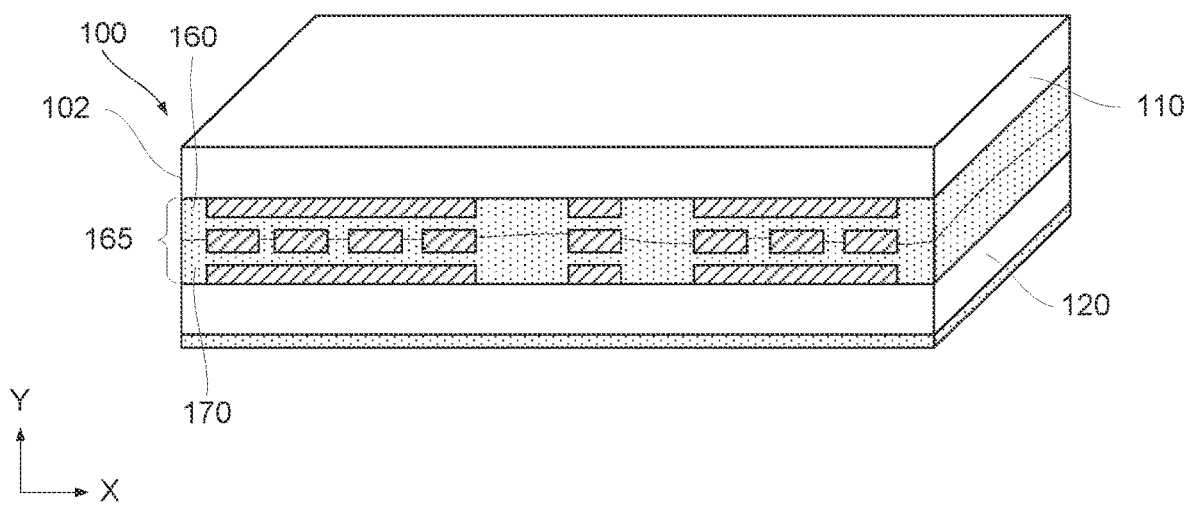
FIG. 1C is a schematic cross-sectional view of another example of the flexible hybrid interconnect circuit in FIG. 1A.

Referring to FIG. 1C, flexible hybrid interconnect circuit 100 comprises one or more inner dielectrics, such as first inner dielectric 160 and second inner dielectric 170. During fabrication of flexible hybrid interconnect circuit 100, first inner dielectric 160 and second inner dielectric 170 may be combined (e.g., laminated) into inner dielectric 165. The boundaries of first inner dielectric 160 and second inner dielectric 170 may or may not be distinguishable in inner dielectric 165. Alternatively, in some examples, fabrication of flexible hybrid interconnect circuit 100 involves using a single inner dielectric 165.

First inner dielectric 160 and second inner dielectric 170 provide insulation and support to different conductive elements. Additional insulation and support are provided by first outer dielectric 110 and second outer dielectric 120. First inner dielectric 160 and second inner dielectric 170 may extend to edge 102 of flexible hybrid interconnect circuit 100 as, for example, shown in FIG. 1C. As such, edge 102 may be formed by first outer dielectric 110, second outer dielectric 120, first inner dielectric 160, and second inner dielectric 170. However, conductive elements do not extend to edge 102 (other than to form external connections) to ensure electrical isolation of these elements.

In this example, first outer dielectric 110 and second outer dielectric 120 require less bending and are less prone to leave unfilled gaps in the sealed space, which may be referred to as "soda straw" defects. These gaps may allow moisture penetration and migration within flexible hybrid interconnect circuit 100. Edge 102 may be formed by "kiss-cutting" or other like techniques. Without being restricted to any particular theory, it is believed that some of these edge-forming techniques may cause intermixing of first inner dielectric 160 and second inner dielectric 170 at least along edge 102, thereby causing more effective sealing. Alternatively, first outer dielectric 110 directly interfaces second outer dielectric 120 at an edge and forms edge 102 as, for example, shown in FIG. 1B. In some examples, one or more conductive elements protrude to or beyond edge 102.

Referring to FIG. 2A, signal transmission portion 130 comprises multiple conductive elements arranged into two or more conductive layers. These layers are stacked along the thickness of flexible hybrid interconnect circuit 100 (the Y-axis). Power transmission portion 190, when one is present, comprises one or more conductive elements arranged into one or more conductive layers. FIG. 2A shows three conductive layers in each of signal transmission portion 130 and power transmission portion 190. However, other numbers of conductive layers in each portion is within the scope.

Referring to FIG. 2A, signal transmission portion 130 comprises signal line 132 and one or more optional shields, such as first shield 134, second shield 136, third shield 138, and fourth shield 139. Each one of these components may be referred to as a conductive element. In this example, third shield 138 forms one conductive layer. Second shield 136, signal line 132, and third shield 138 form another conductive layer. Fourth shield 139 forms yet another conductive layer. In other words, the example of signal transmission portion 130 in FIG. 2A has three conductive layers. However, any other number of conductive layers may be used. For example, FIG. 2E illustrates an example of signal transmission portion 130, which does not have third shield 138. In other words, signal line 132 is only shielded along the Y-axis in one direction by fourth shield 139. FIG. 2F illustrates another example of signal transmission portion 130, which may be referred to as a microstrip. In this example, signal line 132 is only shielded along the Y-axis, and only in one direction, by fourth shield 139. There is no shielding along the X-axis. Other examples are coplanar waveguides (no shields) and striplines (shields on both sides). FIG. 2G illustrates yet another example of signal transmission portion 130, which has four conductive layers. In addition to signal line 132, first shield 134, second shield 136, third shield 138, and fourth shield 139, which form three layers, this signal transmission portion 130 also comprises overpass conductive element 137.

Signal line 132 is configured to carry HF signals, while one or more of first shield 134, second shield 136, third shield 138, and fourth shield 139 forming an electromagnetic shield around signal line 132. Specifically, these shields prevent interference from external electromagnetic noise. These shields also prevent signal line 132 from radiating to the outside environment (e.g., causing electromagnetic noises).

Referring to the example in FIG. 2A, signal line 132 is disposed between first shield 134 and second shield 136, along the width of flexible hybrid interconnect circuit 100 (along the X-axis). Signal line 132 is also disposed between third shield 138 and fourth shield 139, along thickness of flexible hybrid interconnect circuit 100 (along the Y-axis). This example may be referred to as four-sided shielding or an enclosed shielding. Furthermore, in this example, each of third shield 138 and fourth shield 139 overlaps with each of first shield 134 and second shield 136 along the width of flexible hybrid interconnect circuit 100 (along the X-axis). The spacing between first shield 134 and each of third shield 138 and fourth shield 139 (and, similarly, between second shield 136 and each of third shield 138 and fourth shield 139) is sufficiently small to prevent penetration of electromagnetic waves.

Referring to the example in FIG. 2A, each of signal line 132 and one or more shields (e.g., first shield 134, second shield 136, third shield 138 and fourth shield 139) has a substantially rectangular cross-sectional profile, within a plane perpendicular to the length of flexible hybrid interconnect circuit 100. The rectangular profile may be a result of forming these components from the metal sheets (e.g., patterning metal foils as further described below). Specifically, each conductive layer may be formed from a separate metal sheet. Thus, signal line 132, first shield 134, and second shield 136 are formed from the same sheet. Furthermore, the thickness of all conductive elements in the same conductive layer may be the same (e.g., being formed from the same metal sheet).

In some examples, the aspect ratio (the ratio of the width to the thickness) of at least one of signal line 132, first shield 134, second shield 136, third shield 138, and fourth shield 139 is at least about 2, at least about 5, or even at least about 10. The high aspect ratio enhances thermal conductivity to heat sinks (e.g., body panel 210 in FIG. 1B) by increasing the interface area, while also keeping a relatively low thickness of flexible hybrid interconnect circuit 100.

Referring to FIG. 2A, the size of the gap between signal line 132 and third shield 138 along the thickness of flexible hybrid interconnect circuit 100 (the Y-axis) may be less than 0.8 millimeters or, more specifically, less than 0.6 millimeters or even less than 0.4 millimeters. Furthermore, the size of the gap between signal line 132 and fourth shield 139, the gap between second shield 136 and third shield 138, and the gap between second shield 136 and fourth shield 139 may also be within this range. These gaps allow blocking external and internal electromagnetic fields when signal line 132 is operated at a frequency of between about 0 Hz and 100 GHz. Overall, the gaps are smaller than the wavelength of incident waves of electromagnetic fields caused by transmission of a radio frequency (RF) signal in signal line 132. As such, one or more of first shield 134, second shield 136, third shield 138, and fourth shield 139 effectively form a Faraday cage around signal line 132.

The size of the gap between first shield 134 and third shield 138 depends on the thickness and materials of first inner dielectric 160 and processing conditions used to laminate these components while forming flexible hybrid interconnect circuit 100, as further explained below. Similarly, the size of the gap between first shield 134 and fourth shield 139 depends on the size and materials of second inner dielectric 170 and processing conditions used to laminate these components. Referring to FIG. 2A, first inner dielectric 160 may at least partially extend between first shield 134 and third shield 138 as well as between signal line 132 and third shield 138 and between second shield 136 and third shield 138. As such, the size of the gap between first shield 134 and third shield 138 as well as between signal line 132 and third shield 138 and between second shield 136 and third shield 138 may be substantially the same (e.g., to within a variation of less than 20% or even less than 10%). Similarly, second inner dielectric 170 may extend between first shield 134 and fourth shield 139 as well as between signal line 132 and fourth shield 139 and between second shield 136 and fourth shield 139. As such, the size of the gap between first shield 134 and fourth shield 139 as well as between signal line 132 and fourth shield 139 and between second shield 136 and fourth shield 139 may be substantially the same. Furthermore, the gap between first shield 134 and third shield 138 may be substantially the same as the gap between first shield 134 and fourth shield 139. For example, both first inner dielectric 160 and second inner dielectric 170 may have the same thickness and material. The precise control of the gap achieved by first inner dielectric 160 and second inner dielectric 170 allows precise control of the impedance of flexible hybrid interconnect circuit 100, which is inversely proportional to the capacitance.

In some examples, signal line 132 is electrically insulated from each of first shield 134, second shield 136, third shield 138, and fourth shield 139. This insulation prevents signal loss when an HF signal is transferred through signal line 132. Optionally, two or more (e.g., all) of first shield 134, second shield 136, third shield 138, and fourth shield 139 may be interconnected. The interconnection allows forming one common external connection to all shields (e.g., for grounding). Furthermore, unconnected ("floating") shields may be susceptible to capacitive coupling among each other and can also capacitively couple to signal line 132. Various examples of these connections are described below.

In some examples, the thickness of each of signal line 132, first shield 134, and second shield 136 along a thickness of flexible hybrid interconnect circuit 100 is the same. Furthermore, the composition of each of signal line 132, first shield 134, and second shield 136 may be the same. For example, signal line 132, first shield 134, and second shield 136 may be made from the same metal sheet. More generally, each conductive layer of flexible hybrid interconnect circuit 100 may be made from the same metal sheet.

Figure 2D:
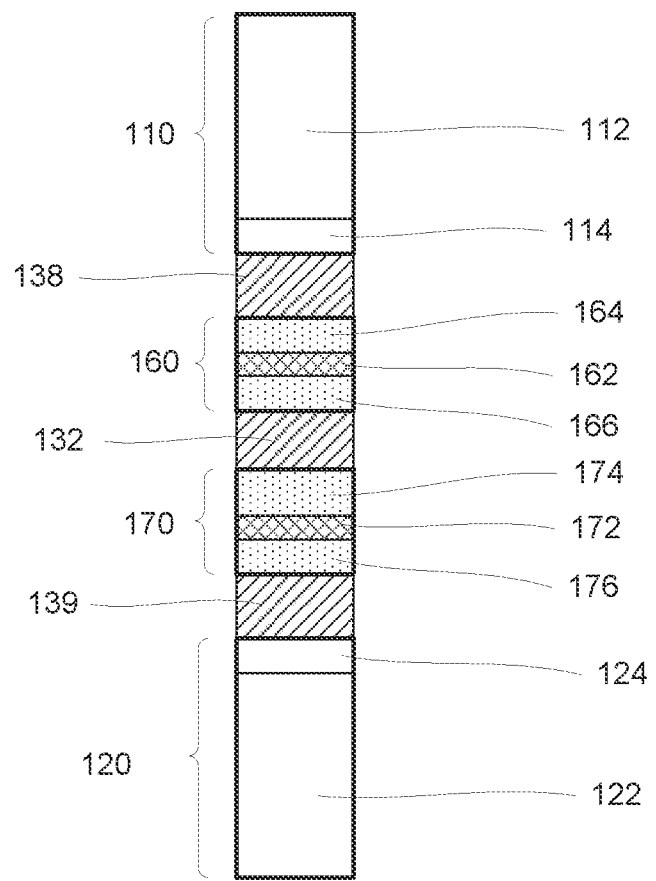
FIG. 2D is an expanded cross-sectional view of another example of the signal transmission portion in FIG. 2A.
Figure 2E:
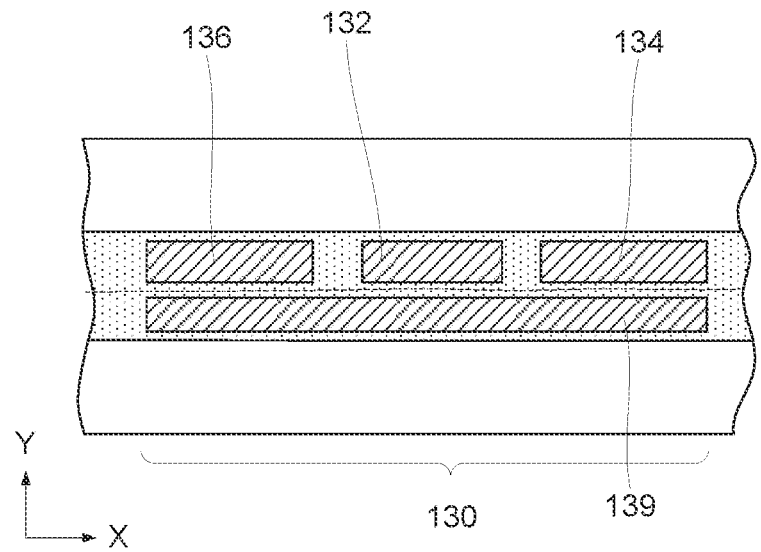
FIG. 2E-FIG. 2G are cross-sectional views of different examples of the signal transmission portion.
Figure 2F:
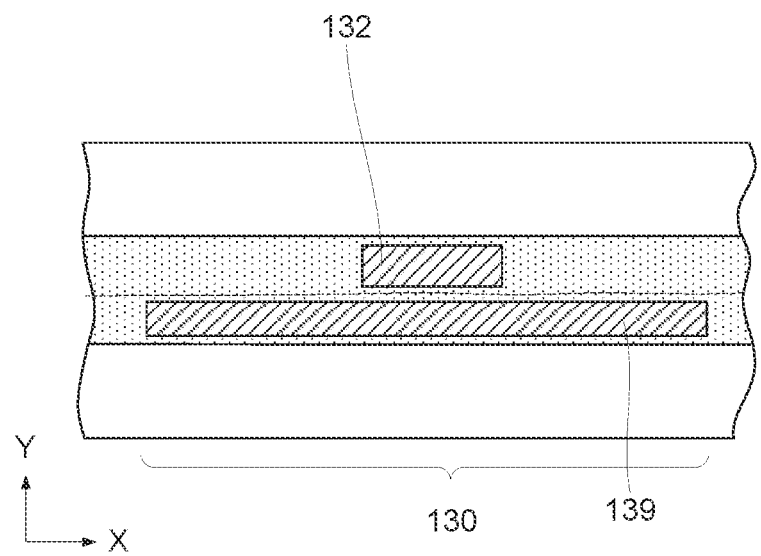
Figure 2G:
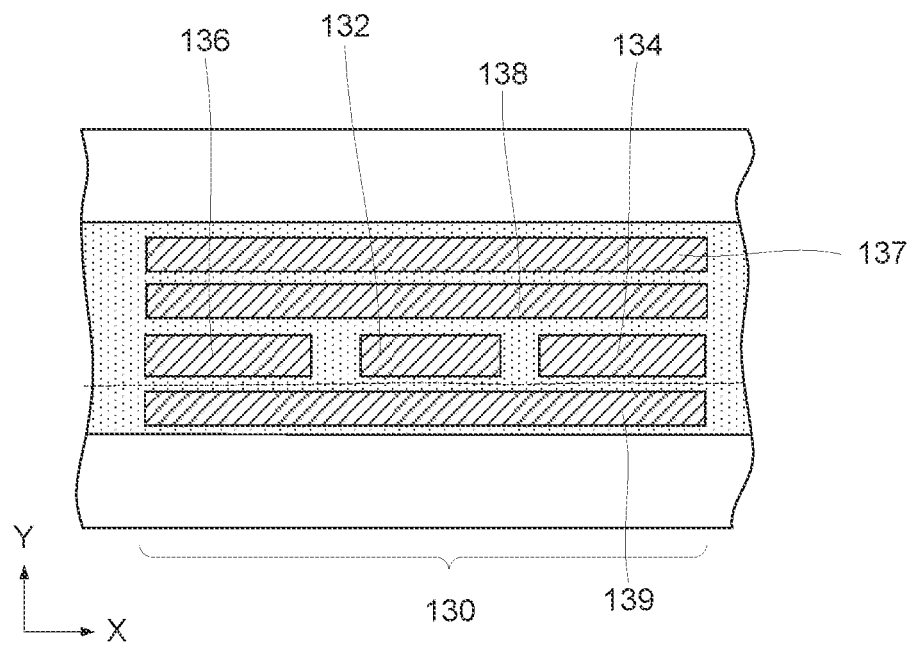
Figure 2H:
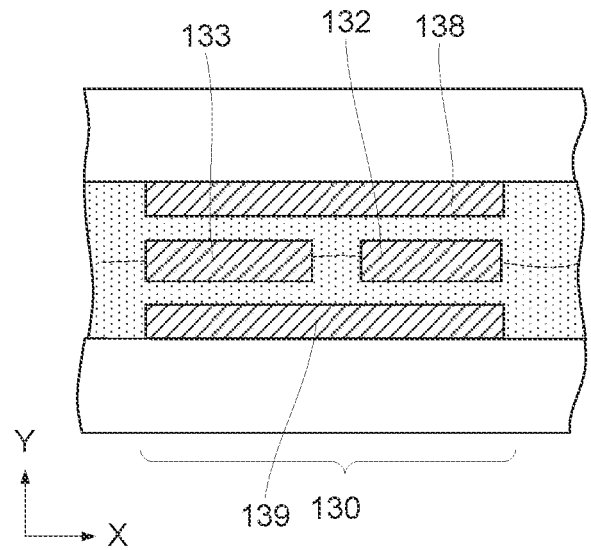
FIG. 2H and FIG. 2I are schematic cross-sectional views of two additional examples of the signal transmission portion of the flexible hybrid interconnect circuit.
Figure 2I:
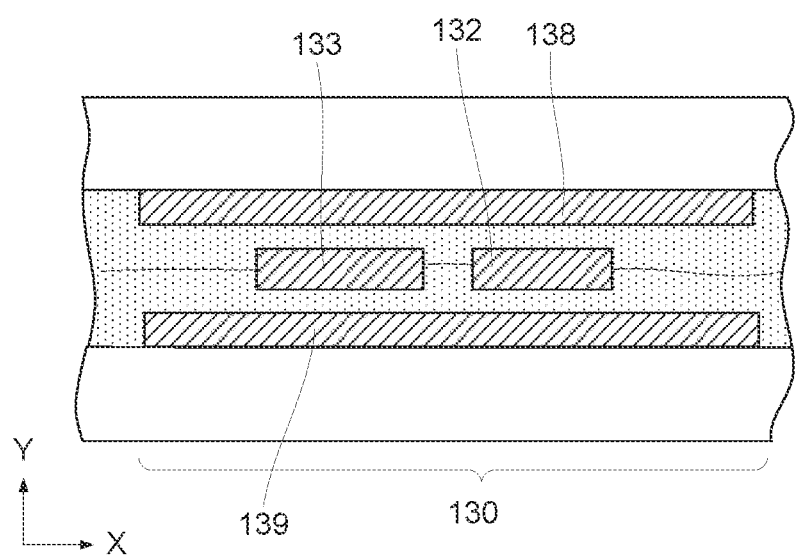

FIG. 2H and FIG. 2I are schematic cross-sectional views of two additional examples of signal transmission portion 130. In each of these examples, signal transmission portion 130 comprises first signal line 132 and second signal line 133, both disposed between third shield 138 and fourth shield 139. These signal lines and shields form a stack along the Y direction. The terms "third" and "fourth" are used for consistency with previous examples and do not imply the presence of other components. Third shield 138 and fourth shield 139 may be referred to as top and bottom shields, without limiting the orientation of signal transmission portion 130.

First signal line 132 and second signal line 133 are offset relative to each other along the X-direction. However, unlike various examples described above with reference to FIG. 2A, signal transmission portion 130 shown in FIG. 2H and FIG. 2I does not have side shields. In other words, there are no shields offset relative to first signal line 132 and second signal line 133 in the X-direction. The "side" shielding features may not be necessary when the spacing between each of first signal line 132 and second signal line 133 and each of third shield 138 and fourth shield 139 is substantially less (e.g., 2× or even 10×) than the wavelength of signals carried by first signal line 132 and second signal line 133.

Referring to FIG. 2H, the right ends of first signal line 132, third shield 138, and fourth shield 139 are aligned (along the Y-axis). Similarly, the left ends of second signal line 133, third shield 138, and fourth shield 139 are aligned (along the Y-axis). This feature reduces the overall footprint of signal transmission portion 130 (along the X-axis), making it more compact.

Referring to FIG. 2I, the right ends of third shield 138 and fourth shield 139 extend to the right (along the X-axis) past the right end of first signal line 132. Similarly, the left ends of third shield 138 and fourth shield 139 extend to the left (along the X-axis) past the left end of second signal line 133. This design provides additional shielding by positioning first signal line 132 and second signal line 133 deeper inside the space between third shield 138 and fourth shield 139 and away from the side openings to this space, therefore reducing the risk of electromagnetic interference.

Figure 2J:
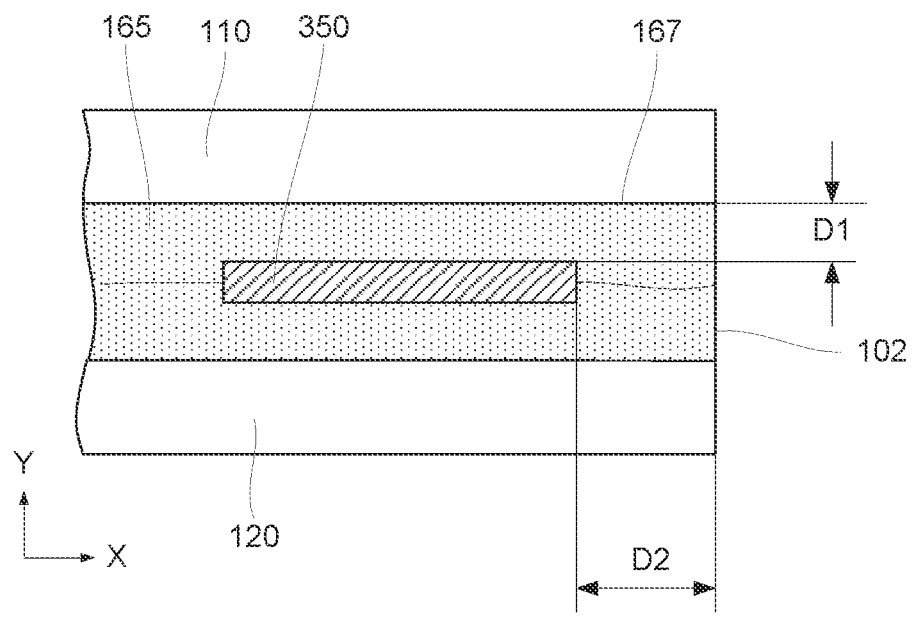
FIG. 2J is a schematic cross-sectional view of an edge portion of the flexible hybrid interconnect circuit, in accordance with some examples.

FIG. 2J illustrates a portion of interconnect circuit 100 near edge 102 of interconnect circuit 100. Conductive element 350 is surrounded by inner dielectric 165. Furthermore, conductive element 350 is positioned at a first distance (D1) from surface 167 of inner dielectric 165 and at a second distance (D2) from edge 102. The first distance (D1) and the second distance (D2) are selected such that inner dielectric 165 does not experience dielectric breakdown when a signal or an electrical power is transmitted through conductive element 350. In some examples, the first distance (D1) is at least 50 micrometers or, more specifically, at least 100 micrometers. In the same or other examples, the second distance (D2) is at least 100 micrometers or, more specifically, at least 200 micrometers. The first distance (D1) may be smaller than the second distance (D2) because surface 167 of inner dielectric 165 further interfaces with first outer dielectric 110, which provides additional electrical isolation to conductive element 350 from the environment. Likewise, the opposite surface of inner dielectric 165 interfaces with second outer dielectric 120, which provides additional electrical isolation.

Figure 2K:
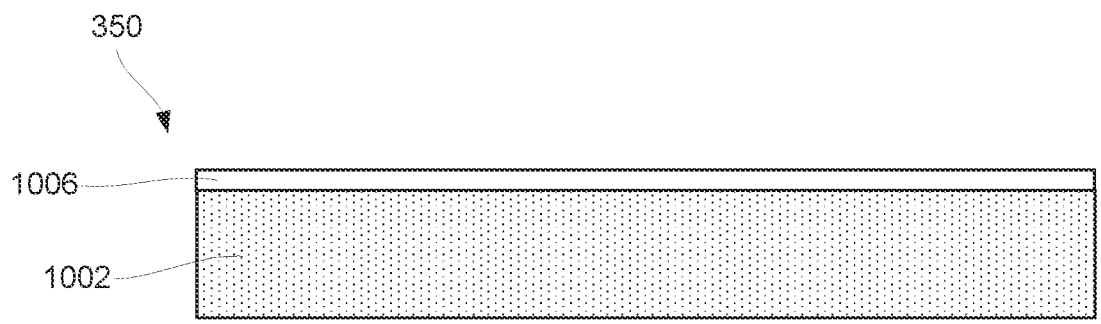
FIG. 2K-FIG. 2M are examples of conductive elements for use in signal transmission portions and/or power transmission portions of flexible hybrid interconnect circuits.
Figure 2L:
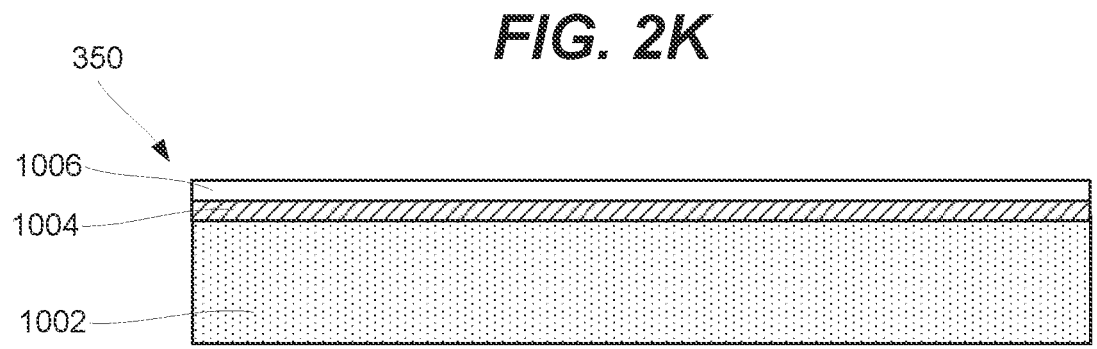
Figure 2M:
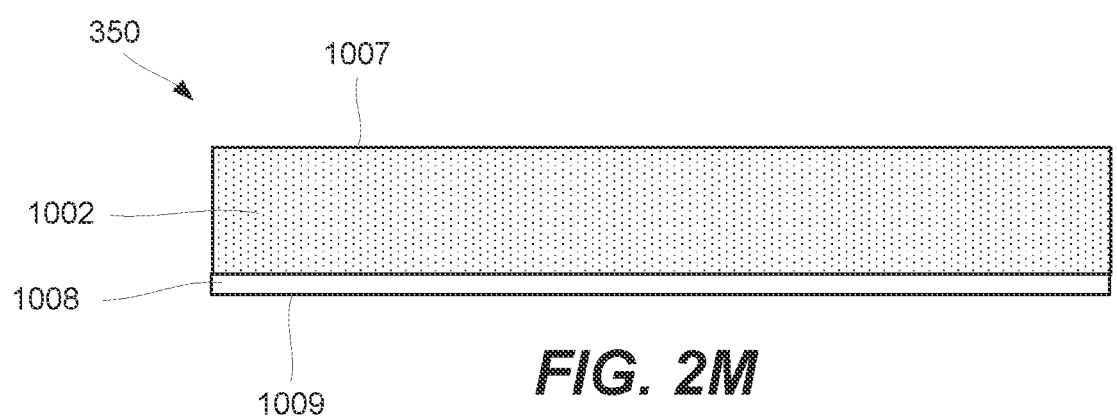

In some examples, one or more conductive elements of flexible hybrid interconnect circuit 100 comprise a base sublayer and a surface sublayer as, for example, shown in FIGS. 2K-FIG. 2M. The base and surface sublayers have different compositions and serve different functions. Referring to FIG. 2K, conductive element 350 comprises base sublayer 1002 and surface sublayer 1006, directly interfacing base sublayer 1002. First inner dielectric 160 and/or second inner dielectric 170 may be laminated over surface sublayer 1006. More specifically, at least a portion of surface sublayer 1006 may directly interface first inner dielectric 160 and/or second inner dielectric 170 (or an adhesive used for attaching these dielectrics). Surface sublayer 1006 may be specifically selected to improve adhesion of first inner dielectric 160 and/or second inner dielectric 170.

Base sublayer 1002 may comprise a metal selected from a group consisting of aluminum, titanium, nickel, copper, and steel, and alloys comprising these metals. The material of base sublayer 1002 may be selected to achieve the desired electrical and thermal conductivities of conductive element 350 (or another conductive element) while maintaining minimal cost.

Surface sublayer 1006 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of surface sublayer 1006 may be selected to protect base sublayer 1002 from oxidation, improve surface conductivity when forming an electrical and/or thermal contact to a device, improve adhesion to conductive element 350 (or another conductive element), and/or other purposes. Furthermore, in some examples, the addition of a coating of OSP on top of surface sublayer 1006 may help prevent surface sublayer 1006 itself from oxidizing over time.

For example, aluminum may be used for base sublayer 1002. While aluminum has good thermal and electrical conductivity, it forms a surface oxide when exposed to air. Aluminum oxide has poor electrical conductivity and may not be desirable at the interface between conductive element 350 and other components making an electrical connection to conductive element 350. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as base sublayer 1002 without compromising electrical conductivity or adhesion between conductive element 350 (or another conductive element) and other components of flexible hybrid interconnect circuit 100.

Surface sublayer 1006 may have a thickness of between about 0.01 micrometers and 10 micrometers or, more specifically, between about 0.1 micrometers and 1 micrometer. For comparison, a thickness of base sublayer 1002 may be between about 10 micrometers and 1000 micrometers or, more specifically, between about 100 micrometers and 500 micrometers. As such, base sublayer 1002 may represent at least about 90% or, more specifically, at least about 95% or even at least about 99% of conductive element 350 (or another conductive element) by volume.

In some examples, conductive element 350 (or another conductive element) further comprises one or more intermediate sublayers 1004 disposed between base sublayer 1002 and surface sublayer 1006 as shown, for example, in FIG. 2L. Intermediate sublayer 1004 has a different composition than base sublayer 1002 and surface sublayer 1006. In some examples, the one or more intermediate sublayers 1004 may help prevent intermetallic formation between base sublayer 1002 and surface sublayer 1006. For example, intermediate sublayer 1004 may comprise a metal selected from a group consisting of chromium, titanium, nickel, vanadium, zinc, and copper.

In some examples, conductive element 350 (or another conductive element) may comprise rolled metal foil. In contrast to the vertical grain structure associated with electrodeposited foil and/or plated metal, the horizontally-elongated grain structure of rolled metal foil may help increase the resistance to crack propagation in conductive elements under cyclical loading conditions. This may help increase the fatigue life of flexible hybrid interconnect circuit 100.

In some examples, conductive element 350 (or another conductive element) comprises electrically insulating coating 1008, which forms surface 1009 of conductive element 350, disposed opposite of conductive surface 1007 as shown, for example, in FIG. 2M. At least a portion of this surface 1009 may remain exposed in flexible hybrid interconnect circuit 100 and may be used for heat removal from flexible hybrid interconnect circuit 100. In some examples, the entire surface 1009 remains exposed in flexible hybrid interconnect circuit 100. Insulating coating 1008 may be selected for relatively high thermal conductivity and relatively high electrical resistivity and may comprise a material selected from a group consisting of silicon dioxide, silicon nitride, anodized alumina, aluminum oxide, boron nitride, aluminum nitride, diamond, and silicon carbide. Alternatively, the insulating coating may comprise a composite material such as a polymer matrix loaded with thermally conductive, electrically insulating inorganic particles.

In some examples, a conductive element is solderable. When a conductive element includes aluminum, the aluminum may be positioned as base sublayer 1002, while surface sublayer 1006 may be made from a material having a melting temperature that is above the melting temperature of the solder. Otherwise, if surface sublayer 1006 melts during circuit bonding, oxygen may penetrate through surface sublayer 1006 and oxidize aluminum within base sublayer 1002. This in turn may reduce the conductivity at the interface of the two sublayers and potentially cause a loss of mechanical adhesion. Hence, for many solders that are applied at temperatures ranging from 150-300° C., surface sublayer 1006 may be formed from zinc, silver, palladium, platinum, copper, nickel, chrome, tungsten, molybdenum, or gold. In some examples, e.g., in cases in which a high-frequency signal is to be transmitted down the signal line, the surface sublayer composition and thickness may be chosen in order minimize resistance losses due to the skin effect.

Referring to FIG. 2A, flexible hybrid interconnect circuit 100 further comprises power transmission portion 190. Similar to signal transmission portion 130, power transmission portion 190 is disposed between first outer dielectric 110 and second outer dielectric 120. Furthermore, power transmission portion 190 is offset relative to signal transmission portion 130 along the width of flexible hybrid interconnect circuit 100 (along the X-axis in FIG. 2A). The distance between power transmission portion 190 and signal transmission portion 130 may be referred to as separation portion 195. The width of separation portion 195 may be at least 2 times the width of signal line 132 or, more specifically, at least 4 times or even at least 6 times.

Referring to the example in FIG. 2A, power transmission portion 190 is formed from three conductive layers and comprises three conductive elements, which may be referred to as first power conductor 192, second power conductor 194, and third power conductor 196. However, two of these power conductors are optional. In other words, power transmission portion 190 may have any number of power conductors, i.e., one, two, three, four, and so forth. When two or more power conductors are present and stacked along the thickness of flexible hybrid interconnect circuit 100 (along the Y-axis in FIG. 2A), all of these conductors may be used for power transmission. Alternatively, one or more may be used as shields or not present at all.

Referring to the example in FIG. 2A, third power conductor 196 is disposed between first power conductor 192 and second power conductor 194 along the thickness of flexible hybrid interconnect circuit 100, thereby forming a stack (along the Y-axis in FIG. 2A). First inner dielectric 160 may be disposed between first power conductor 192 and third power conductor 196 and used to support first power conductor 192 and third power conductor 196 relative to each other. Similarly, second inner dielectric 170 may be disposed between second power conductor 194 and third power conductor 196 and used to support second power conductor 194 and third power conductor 196 relative to each other.

The size of the gap between first power conductor 192 and third power conductor 196 depends on the thickness and materials of first inner dielectric 160 and processing conditions used to laminate these components while forming flexible hybrid interconnect circuit 100, as further explained below. Similarly, the size of the gap between second power conductor 194 and third power conductor 196 depends on the size and materials of second inner dielectric 170 and processing conditions used to laminate these components. The gap between first power conductor 192 and third power conductor 196 may be substantially the same as the gap between second power conductor 194 and third power conductor 196. As noted above, in some examples, both first inner dielectric 160 and second inner dielectric 170 may have the same thickness and material.

The stack formed by first power conductor 192, second power conductor 194, and third power conductor 196 may be similar to the stack formed by third shield 138, signal line 132, and fourth shield 139. In some examples, third shield 138 and first power conductor 192 may be formed from the same metal sheet. Similarly, signal line 132 and third power conductor 196 may be formed from the same metal sheet. Finally, second power conductor 194 and fourth shield 139 may be formed from the same metal sheet.

Stacking first power conductor 192, second power conductor 194, and third power conductor 196 along the thickness of flexible hybrid interconnect circuit 100 eliminates the problem of crossing conductors while routing flexible hybrid interconnect circuit 100, as will now be explained with reference to FIGS. 3A-3D.

Figure 3A:
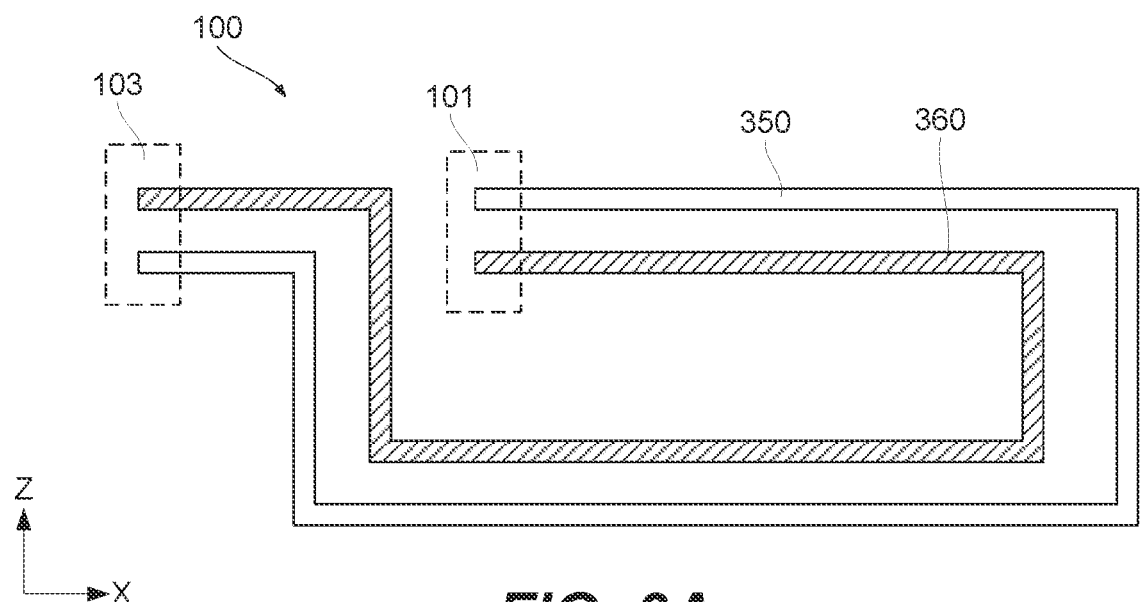
FIG. 3A illustrates a top view of a conventional circuit with a side-by-side arrangement of conductive elements.

FIG. 3A illustrates a top view of reference circuit 100 with a side-by-side arrangement of its conductive elements, i.e., first conductive element 350 and second conductive element 360. When reference circuit 300 is routed as shown in FIG. 3A, the relative orientation of first conductive element 350 and second conductive element 360 is flipped between first end 101 and second end 103. Specifically, at first end 101, first conductive element 350 is shifted upward along the Z-axis relative to second conductive element 360. On the other hand, at second end 103, first conductive element 350 is shifted downward along the Z-axis relative to second conductive element 360. This orientation change may be referred to as a "cross-over."

Figure 3B:
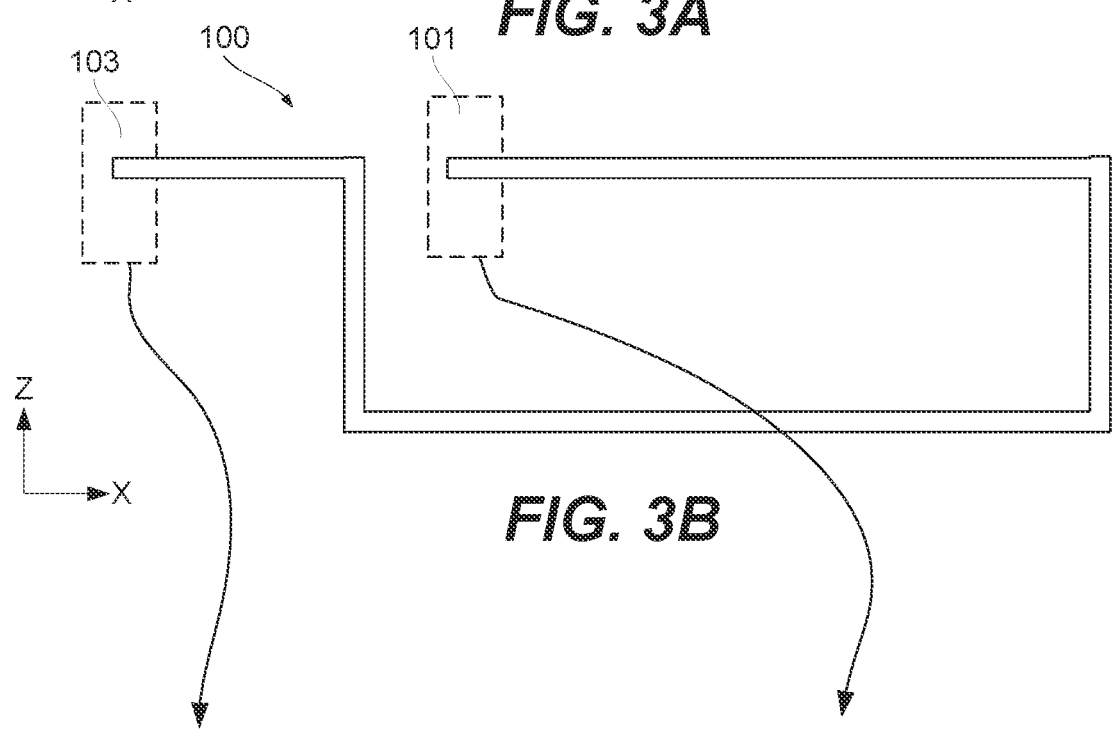
FIG. 3B illustrates a top view of a flexible hybrid interconnect circuit with a stacked arrangement of conductive elements.
Figure 3C:
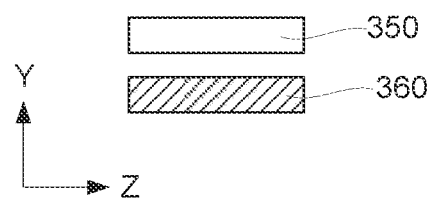
FIG. 3C and FIG. 3D illustrate consistent relative positions of conductive elements in the flexible hybrid interconnect circuit of FIG. 3B.
Figure 3D:
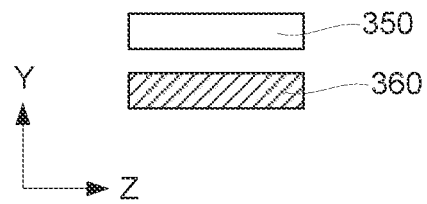

FIG. 3B illustrates a top view of flexible hybrid interconnect circuit 100 with a stacked arrangement of conductive elements. Referring to FIGS. 3C and 3D, first conductive element 350 is shifted upward along the Y-axis relative to second conductive element 360 at both first end 101 and second end 103. This orientation of first conductive element 350 and second conductive element 360 for any routing of flexible hybrid interconnect circuit 100 within X-Z plane, including our of plane deviations.

Dielectric Examples

Returning to FIG. 2A, flexible hybrid interconnect circuit 100 comprises first inner dielectric 160 and second inner dielectric 170. First inner dielectric 160 is disposed between signal line 132 and third shield 138 as well as between first shield 134 and third shield 138 and between second shield 136 and third shield 138. First inner dielectric 160 provides support to these components of flexible hybrid interconnect circuit 100. Furthermore, first inner dielectric 160 ensures that signal line 132 is electrically insulated from third shield 138, first shield 134, and second shield 136 by maintaining relative positions of these shields during operation of flexible hybrid interconnect circuit 100.

Second inner dielectric 170 is disposed between signal line 132 and fourth shield 139 as well as between first shield 134 and fourth shield 139 and between second shield 136 and fourth shield 139. Similar to first inner dielectric 160, second inner dielectric 170 provides supports to these components of flexible hybrid interconnect circuit 100. Furthermore, second inner dielectric 170 ensures that signal line 132 is electrically insulated from fourth shield 139, first shield 134, and second shield 136 by maintaining their relative positions.

Generally, a thicker inner dielectric layer (e.g., first inner dielectric 160 and second inner dielectric 170) results in a lower capacitance. This, in turn, allows forming a wider signal line 132 while still matching the overall capacitance per unit length with the rest of flexible hybrid interconnect circuit 100. When signal line 132 is wider, there are lower resistive losses of the signal and provides better HF performance.

First inner dielectric 160 and/or second inner dielectric 170 may be formed from one or more materials having a dielectric constant less than 2 or even less than 1.5. In some examples, these materials are closed-cell foams. Furthermore, first inner dielectric 160 and/or second inner dielectric 170 may be formed from one or more materials that do not absorb water.

In some examples, at least one of first inner dielectric 160 and second inner dielectric 170 comprises or consists essentially of crosslinked polyethylene (XLPE). More specifically, both first inner dielectric 160 and second inner dielectric 170 comprise or consist essentially of crosslinked XLPE. For purposes of this disclosure, the term "consisting essentially" is defined as a composition of at least about 95% by weight. In some examples, the crosslinked XLPE, used for first inner dielectric 160 and/or second inner dielectric 170, is highly crosslinked XLPE, in which the degree of cross-linking is at least about 40%, at least about 70%, or even at least about 80%. Crosslinking prevents flowing/movement of first inner dielectric 160 and/or second inner dielectric 170 within the operating temperature range of flexible hybrid interconnect circuit 100, which may be between about −40° C. (−40° F.) to +105° C. (+220° F.). This lack of flow prevents shorts between signal line 132, shields, and/or other conductive elements of flexible hybrid interconnect circuit 100. Furthermore, crosslinking prevents oozing of first inner dielectric 160 and second inner dielectric 170 from edges and openings of flexible hybrid interconnect circuit 100.

Conventional flexible circuits do not use XLPE primarily because of various difficulties with patterning conductive elements (by etching) against the backing formed from XLPE. XLPE is not sufficiently robust to withstand conventional etching techniques.

In some examples, the materials of first outer dielectric 110, second outer dielectric 120, first inner dielectric 160, and/or second inner dielectric 170 are specifically selected to enhance the flexibility of flexible hybrid interconnect circuit 100. Some suitable examples are polyolefins, which are predominantly linear polymers (as compared to polyesters, which contain an aromatic ring and therefore are less flexible). In particular, silane-modified polyolefins may be used for one or both inner dielectric layers. Some specific combinations include a modified polypropylene for one or both outer dielectric layers and a modified linear low-density polyethylene (LLDPE) for one or both inner dielectric layers. In other examples, a modified polypropylene may be used for all inner and outer dielectric layers. In yet another example, a co-extruded material comprising a modified LLDPE and a modified polypropylene may be used for at least one of the inner and outer dielectric layers. In general, a coextruded film comprising a combination of a high-melt polymer and a low-melt polymer may be used for flexible hybrid interconnect circuit 100. The high-melt polymer may function as an outer dielectric, while the low-melt polymer may function as an inner dielectric and used for gap fill between conductive leads.

In some examples, a thermoplastic polyurethane (TPU) or, more specifically, a polyurethane ether may be used as one or both of outer dielectrics. The flexibility of polyurethanes can be tuned by using appropriate chemistry. Furthermore, one or more fire retardants (e.g., non-halogenated fire retardants) may be incorporated into one or both of the outer dielectric layers. Various examples of fire retardants are described below.

In some examples, first outer dielectric 110, second outer dielectric 120, first inner dielectric 160, and/or second inner dielectric 170 comprise one or more transparent materials, e.g., one or more elastomeric polymers, such as ethylene-butylene copolymers, plasticizer-compounded polyolefins, and the like.

In some examples, at least one of the dielectrics comprises a flame retardant, e.g., phosphorus, organophosphorus, and the like. The flame retardant may be added, e.g., as particles, into a polymer matrix, various examples of which are listed above. Alternatively, a flame retardant may be in the form of a standalone structure, e.g., a flame retardant paper or a flame barrier. More specifically, one of first outer dielectric 110 or second outer dielectric 120 is polyethylene naphthalate (PEN), while the other one is a flame retardant paper. It should be noted that conventional circuits (formed by etching and other like processes) are not able to use flame barriers for their dielectric layers. In some examples, polyimide (PI) may be used for one or more dielectric layers, in addition or instead of flame retardants because of its inherent combustion resistant properties.

In some examples, first outer dielectric 110 and/or second outer dielectric 120 comprises a coefficient of thermal expansion (CTE)-matching additive. The composition and concentration of the CTE-matching additive in these dielectric layers are specifically selected to match that of conductive elements or, more specifically, a combination of the conductive elements and/or more inner dielectrics. It should be noted that flexible hybrid interconnect circuit 100 may be subjected to temperature fluctuations during its manufacturing (e.g., one or more lamination operations described below) and/or operation (e.g., operating in an engine bay of a vehicle). For example, one or both of first outer dielectric 110 and second outer dielectric 120 comprises a polymer matrix, comprising polyethylene terephthalate (PET) and/or polyethylene naphthalate (PEN), and a CTE-matching additive, distributed within this matrix and comprising inorganic fillers, such as glass fibers, and mica/silica. The CTE-matching additive may be in the form particles having a low aspect ratio (e.g., less than 0.5) or having a high aspect ratio (e.g., greater than 1). The concentration of the CTE-matching additive in one or both of first outer dielectric 110 and second outer dielectric 120 is between 10% by weight and 50% by weight. While high concentrations of the CTE-matching additive may help to reduce the CTE mismatch, the flexibility of these dielectrics may suffer from excessive amounts of the CTE-matching additive.

Referring to FIG. 2B, in some examples, the composition of first inner dielectric 160 is uniform throughout its thickness (the Y direction). Likewise, the composition of second inner dielectric 170 may be uniform throughout its thickness. Alternatively, in another example presented in FIG. 2D, first inner dielectric 160 comprises first inner base 162, first inner outer-facing adhesive 164, and first inner inner-facing adhesive 166. In this example, first inner base 162 is disposed between first inner outer-facing adhesive 164 and first inner inner-facing adhesive 166, along the thickness of flexible hybrid interconnect circuit 100. The composition of first inner base 162 differs from the composition of first inner outer-facing adhesive 164 and from the composition of first inner inner-facing adhesive 166. The compositions of first inner outer-facing adhesive 164 and first inner inner-facing adhesive 166 may be the same. For example, first inner base 162 may comprise polyethylene terephthalate (PET), polyimide (PI), or polyethylene naphthalate (PEN). One or both of first inner outer-facing adhesive 164 and first inner inner-facing adhesive 166 may comprise an adhesive material including but not limited to XDPE, low-density polyethylene (LDPE), polyester (PET), acrylic, ethyl vinyl acetate (EVA), epoxy, pressure-sensitive adhesives, or the like.

In this example, the structure of second inner dielectric 170 is the same as the structure of first inner dielectric 160. Specifically, second inner dielectric 170 comprises second inner base 172, second inner outer-facing adhesive 174, and second inner inner-facing adhesive 176. Second inner base 172 is disposed between second inner outer-facing adhesive 174 and second inner inner-facing adhesive 176, along the thickness of flexible hybrid interconnect circuit 100. In other examples, the structure of second inner dielectric 170 is different from the structure of first inner dielectric 160.

Using a combination of first inner base 162, first inner outer-facing adhesive 164, and first inner inner-facing adhesive 166 allows forming a first inner dielectric 160 that is thinner and, more specifically, tailoring properties of individual components of first inner dielectric 160. For example, first inner outer-facing adhesive 164 and first inner inner-facing adhesive 166 may easily flow during lamination filling the voids between conductive elements of flexible hybrid interconnect circuit 100. Briefly referring to FIG. 2A, first inner dielectric 160 directly interfaces second inner dielectric 170 between signal line 132 and first shield 134, and some degree of flow and gap filling may be required. Furthermore, the presence of first inner base 162 and second inner base 172 may provide a degree of mechanical toughness to ensure that third shield 138 and fourth shield 139 do not undesirably punch through first inner dielectric layer 160 and second inner dielectric layer 170, leading to an electrical short to signal line 132. In some examples, first inner outer-facing adhesive 164 directly interfaces third shield 138. Furthermore, first inner inner-facing adhesive 166 directly interfaces signal line 132.

The presence of inner base layers also affects the HF performance of flexible hybrid interconnect circuit 100 (e.g., decreasing the capacitance and signal absorption). However, inner base layers provide robust separation and reduce the risk of mechanical "punch-through" of the inner dielectric layers. In some examples, the thick inner dielectric layers made from XLPE are used.

In the example shown in FIG. 2D, first outer dielectric 110 comprises first outer base 112 and first outer adhesive 114. Similarly, second outer dielectric 120 comprises second outer base 122 and second outer adhesive 124. First outer base 112 may be polyethylene terephthalate (PET), polyimide (PI), polyethylene naphthalate (PEN), polytetrafluoroethylene (PTFE), polyether ether ketone (PEEK) or any other flexible insulating material. First outer adhesive 114 may comprise an adhesive material including but not limited to XDPE, low-density polyethylene (LDPE), polyester (PET), acrylic, ethyl vinyl acetate (EVA), epoxy, pressure-sensitive adhesives, or the like.

Examples of Interconnecting within Stack

In some examples, one or more conductive elements of flexible hybrid interconnect circuit 100 are electrically connected. For example, one or all shields surrounding signal line 132 may be interconnected, e.g., to avoid a "floating" shield problem. These electrical connections may be formed using portions of these conductive elements or some additional conductive elements, e.g., interconnecting vias, interconnecting plugs, or tabs. FIGS. 4A-4E illustrate different examples and stages of interconnecting first conductive element 350, second conductive element 360, and third conductive element 370 using interconnecting via 310. Each of first conductive element 350, second conductive element 360, and third conductive element 370 may represent any one of the shields, signal lines, and/or power conductors discussed above with reference to FIG. 2A and other figures.

Figure 4A:
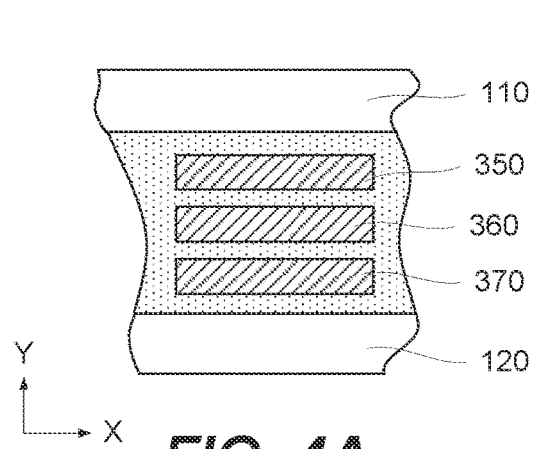
FIG. 4A-FIG. 4E illustrate different stages and examples of forming connections to conductive elements of a flexible hybrid interconnect circuit.
Figure 4B:
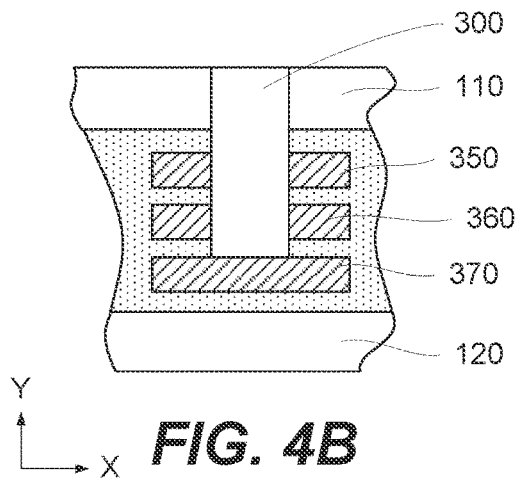

Specifically, FIG. 4A illustrates a stack formed by first conductive element 350, second conductive element 360, and third conductive element 370 before forming any electrical connections. These shields are disposed between first outer dielectric 110 and second outer dielectric 120 prior to forming any connections. FIG. 4B illustrates this stack after forming optional opening 300 through first outer dielectric 110, first conductive element 350, and second conductive element 360. Opening 300 may be formed using, for example, an etching process or any other suitable process. Opening 300 provides access to all three shields allowing for interconnecting all three and, in some examples, forming external connections extending past first outer dielectric 110.

Figure 4C:
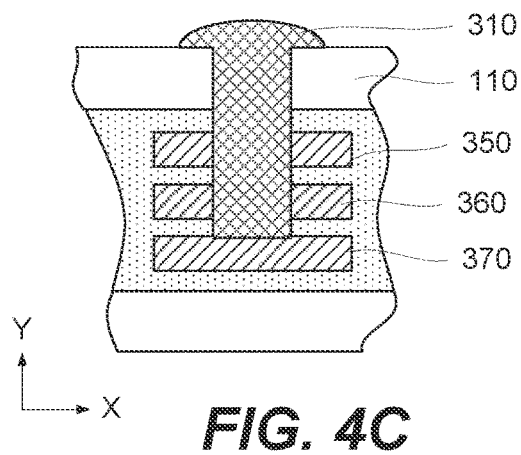

FIG. 4C illustrates the same stack with interconnecting via 310 extending through first outer dielectric 110, first conductive element 350, and second conductive element 360 and contacting third conductive element 370. Interconnecting via 310 is formed from a conductive material, such as copper or any other suitable material. Interconnecting via 310 directly contacts first conductive element 350, second conductive element 360, and third conductive element 370, thereby interconnecting these shields. Furthermore, in this example, interconnecting via 310 extends outside of first outer dielectric 110, which allows forming an external electrical connection to interconnecting via 310 and to first conductive element 350, second conductive element 360, and third conductive element 370. For example, first conductive element 350, second conductive element 360, and third conductive element 370 may be externally grounded through interconnecting via 310. In some examples, interconnecting via 310 comprises a plated element, a solder joint, a metal rivet, or a metal crimp terminal allowing forming an external connection to interconnecting via 310.

Figure 4D:
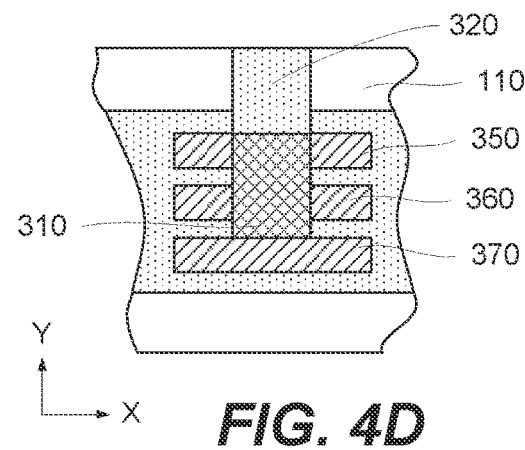

FIG. 4D illustrates another example of interconnecting via 310, which also directly contacts first conductive element 350, second conductive element 360, and third conductive element 370, thereby interconnecting these shields. However, in this example, interconnecting via 310 does not extend through first outer dielectric 110. Instead, insulating plug 320 may be used to fill the portion of the opening extending through first outer dielectric 110. In some examples, interconnecting via 310 may be installed prior to laminating first outer dielectric 110 to the stack such that first outer dielectric 110 does not need an opening for installing interconnecting via 310 and insulating plug 320 is not installed.

Figure 4E:
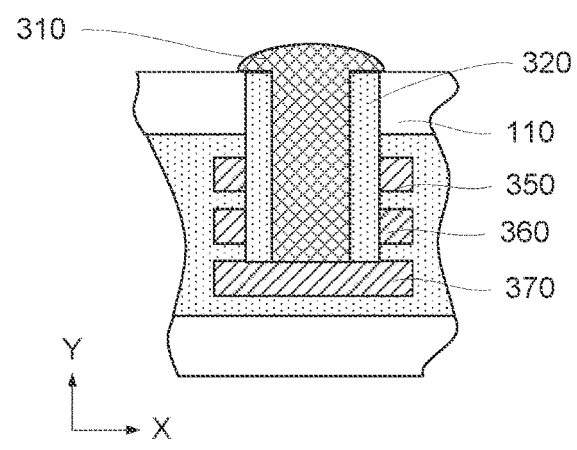

In some examples, an external connection is needed to a conductive element that is blocked by other one or more conductive elements, which should not be connected to this blocked conductive element. FIG. 4E illustrates such an example where interconnecting via 310 is connected to third conductive element 370 but not to first conductive element 350 and second conductive element 360. Yet, interconnecting via 310 protrudes through first conductive element 350 and second conductive element 360 such that connection to third conductive element 370 is available externally, past first outer dielectric 110. In this example, insulating plug 320 forms a shell around sidewalls of interconnecting via 310 and insulates interconnecting via 310 from first conductive element 350 and second conductive element 360, through which interconnecting via 310 protrudes.

While the above examples described interconnections between first conductive element 350, second conductive element 360, and third conductive element 370 or making a connection to one or more of these shields, one having ordinary skill in the art would understand that these connection aspects can be applied to any conductive elements of flexible hybrid interconnect circuit 100.

Figure 4F:
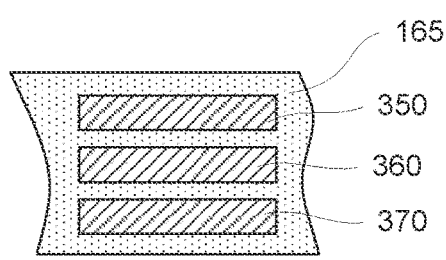
FIGS. 4F-FIG. 4I illustrate additional examples of forming connections between the conductive elements of a flexible hybrid interconnect circuit.

FIGS. 4F-4I illustrate additional examples of forming electrical connections to conductive elements in a stack of a flexible hybrid interconnect circuit. The stack, shown in FIG. 4F, is similar to the one described above with reference to FIG. 4A but it does not include first outer dielectric 110 and second outer dielectric 120. First outer dielectric 110 and second outer dielectric 120 are added later, e.g., after interconnecting the conductive elements of the stack, as further described below with reference to FIG. 4I. With this approach, first outer dielectric 110 and second outer dielectric 120 also insulate interconnecting via 310 and do not have openings.

Specifically, the stack shown in FIG. 4F comprises first conductive element 350, second conductive element 360, and third conductive element 370, which may represent shields, signal lines, and/or power conductors, discussed above with reference to FIG. 2A and other figures. First conductive element 350, second conductive element 360, and third conductive element 370 are supported (e.g., with respect to each other and other components of the flexible hybrid interconnect circuit) with inner dielectric 165. Furthermore, inner dielectric 165 may also electrically isolate first conductive element 350, second conductive element 360, and third conductive element 370 from each other (at least at this processing stage) and, at least partially, from the environment.

Figure 4G:
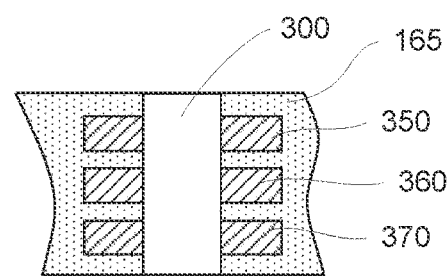

FIG. 4G illustrates the stack after forming opening 300 through first conductive element 350, second conductive element 360, and third conductive element 370, and inner dielectric 165. In this example, opening 300 is a through-hole, which may be easier to form than a blind hole, described above with reference to FIG. 4B. Opening 300 may be formed using, for example, an etching process or any other suitable process. Opening 300 provides access to all three shields allowing for interconnecting these shields.

Figure 4H:
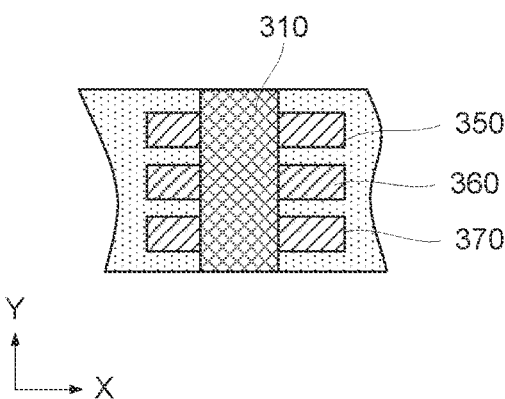

FIG. 4H illustrates a processing stage, after interconnecting via 310 has been added into opening 300. Interconnecting via 310 directly contacts first conductive element 350, second conductive element 360, and third conductive element 370, thereby interconnecting all three elements. Interconnecting via 310 may comprise a plated element, a conductive adhesive, a solder joint, a metal rivet, or a metal crimp terminal allowing forming an external connection to interconnecting via 310.

In some examples, a portion of opening 300 may be filled with a non-conductive element (e.g., an insulator plug), while the rest of opening 300 is filled with interconnecting via 310. This alternative approach allows interconnecting fewer than all conductive elements in the stack. For example, first conductive element 350 and second conductive element 360 may be interconnected, but remain insulated from third conductive element 370 after interconnecting via 310 is installed into opening 300. Likewise, third conductive element 370 and second conductive element 360 may be interconnected, but remain insulated from first conductive element 350.

Figure 4I:
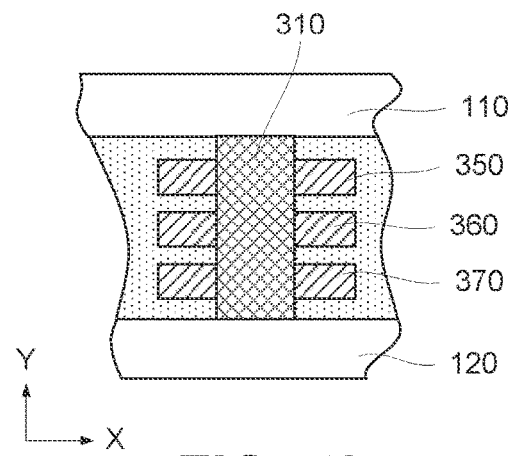

FIG. 4I illustrates the stack with first outer dielectric 110 and second outer dielectric 120. These outer dielectrics are added after interconnecting first conductive element 350, second conductive element 360, and third conductive element 370. In this example, first outer dielectric 110 and second outer dielectric 120 extend over inner dielectric 165 and interconnecting via 310. More specifically, first outer dielectric 110 and second outer dielectric 120 isolate (electrically and mechanically) interconnecting via 310 from the environment.

Figure 5A:
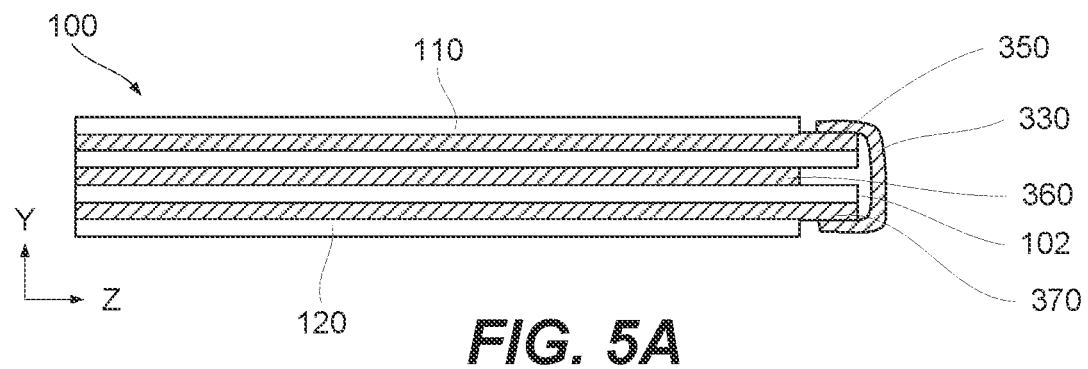
FIG. 5A and FIG. 5B illustrate examples of interconnecting conductive elements using an external interconnecting jumper, extending over the edge of the stack formed by the conductive elements and internal dielectrics.

FIG. 5A illustrates an example of flexible hybrid interconnect circuit 100, having first conductive element 350 and third conductive element 370 connected using interconnecting jumper 330, which may be referred to as an external interconnecting jumper. In this example, interconnecting jumper 330 loops around edge 102 of the stack. Second conductive element 360 as well as first outer dielectric 110 and second outer dielectric 120 may be positioned away from edge 102 and from interconnecting jumper 330, thereby maintaining electrical insulation from interconnecting jumper 330, first conductive element 350, and third conductive element 370.

Figure 5B:
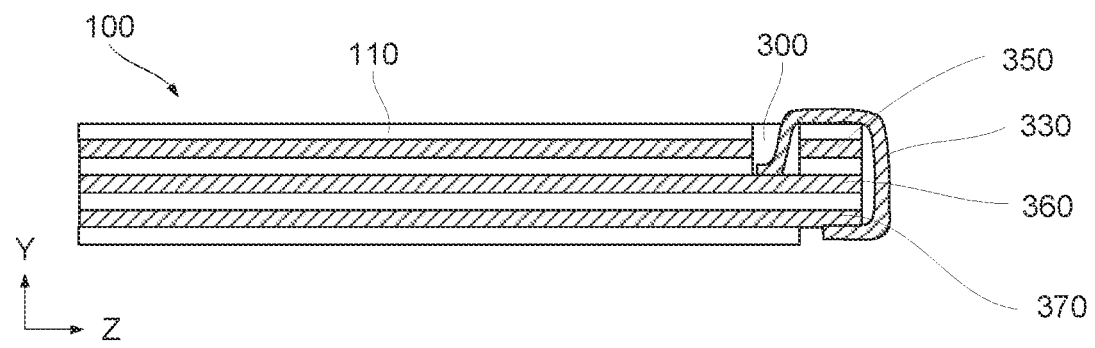

FIG. 5B illustrates another example of flexible hybrid interconnect circuit 100 in which second conductive element 360 is connected to third conductive element 370 using interconnecting jumper 330. In this example, first conductive element 350 and first outer dielectric 110 have opening 300 allowing interconnecting jumper 330 to reach second conductive element 360. In some embodiments, once the connection is made, opening 300 is filled with an insulating material, e.g., to seal opening 300 and provide insulation between interconnecting jumper 330 and first conductive element 350.

Figure 6A:
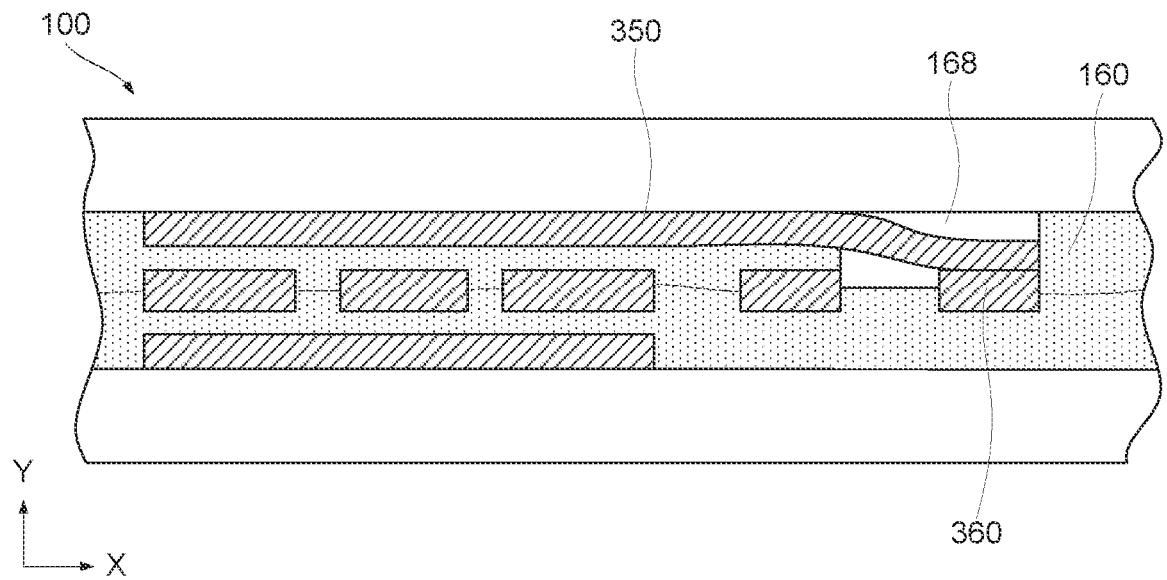
FIG. 6A and FIG. 6B illustrate examples of interconnecting conductive elements using conductive elements of an internal conductive tab positioned between outer dielectric layers.

FIG. 6A illustrates an example of flexible hybrid interconnect circuit 100, in which first conductive element 350 and second conductive element 360, positioned at different conductive levels of the stack, are connected directly. In this example, first inner dielectric 160 comprises dielectric opening 168 allowing first conductive element 350 to extend into and make contact with second conductive element 360. This connection may be made using one of the connection means described above, or may be welded, e.g., using laser, ultrasonic, or resistive welding.

Figure 6B:
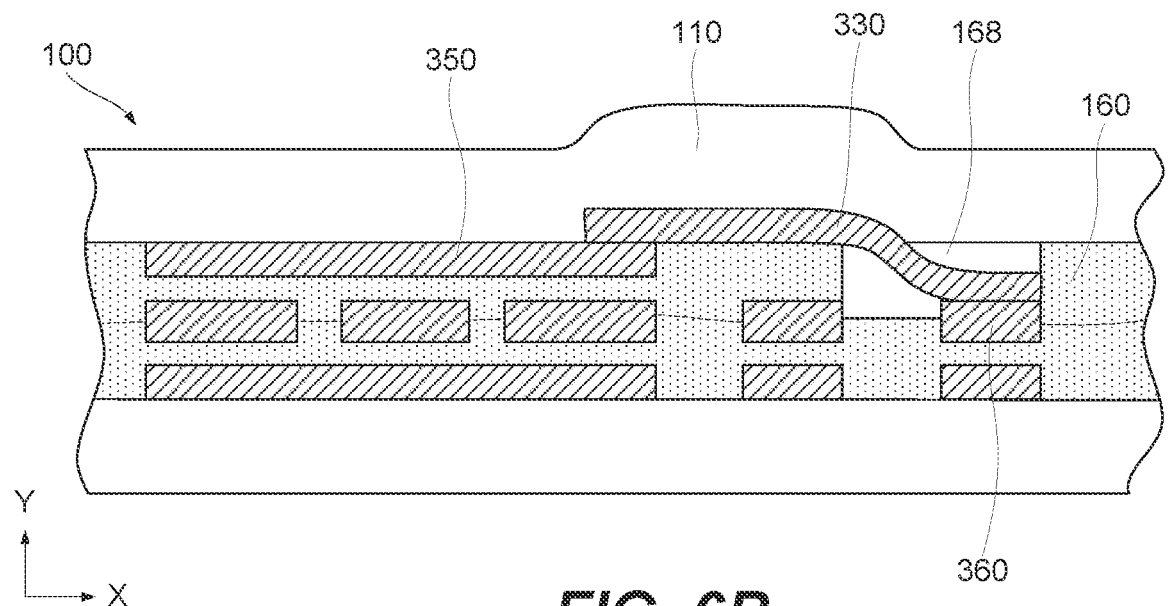

FIG. 6B illustrates another example of flexible hybrid interconnect circuit 100, in which first conductive element 350 and second conductive element 360 are connected. Similar to the example of FIG. 6A, this type of connection may be referred to as an internal connection since this connection does not protrude outside of outer dielectric layers. Referring to FIG. 6B, the connection is formed using interconnecting jumper 330, which protrudes through dielectric opening 168 in first inner dielectric 160. The interconnected conductive elements are positioned at different conductive layers. However, one having ordinary skill in the art would understand that such connections may be implemented between conductive elements positioned at the same level.

Figure 7:
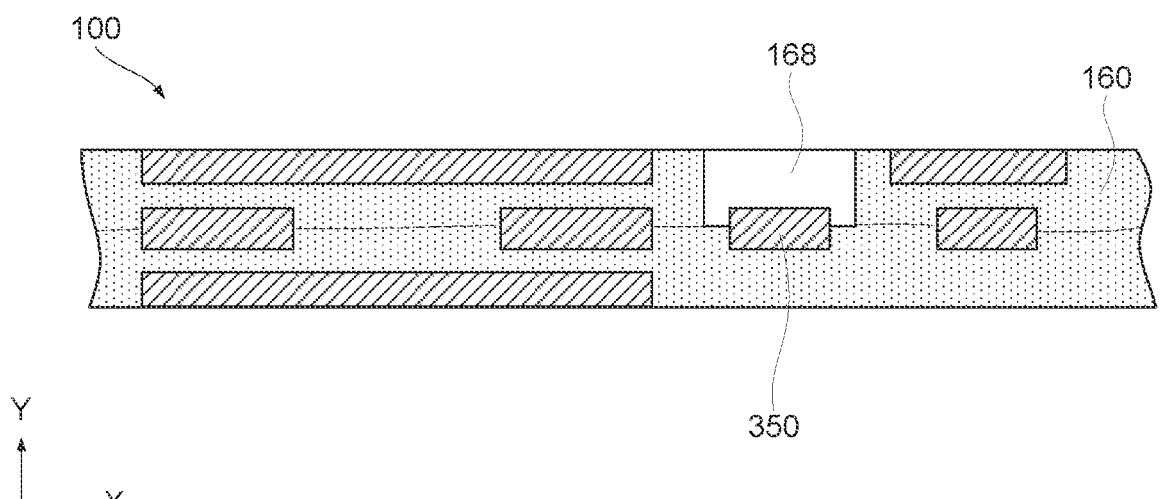
FIG. 7 illustrates an example of a patterned inner dielectric layer providing access to a conductive element.

FIG. 7 illustrates another example of flexible hybrid interconnect circuit 100, in which dielectric opening 168 in first inner dielectric 160 provides access for making a connection to first conductive element 350. In some examples, not shown, the same dielectric opening may provide access to multiple conductive components, positioned at the same or different conductive levels.

Shield Examples

Figure 8A:
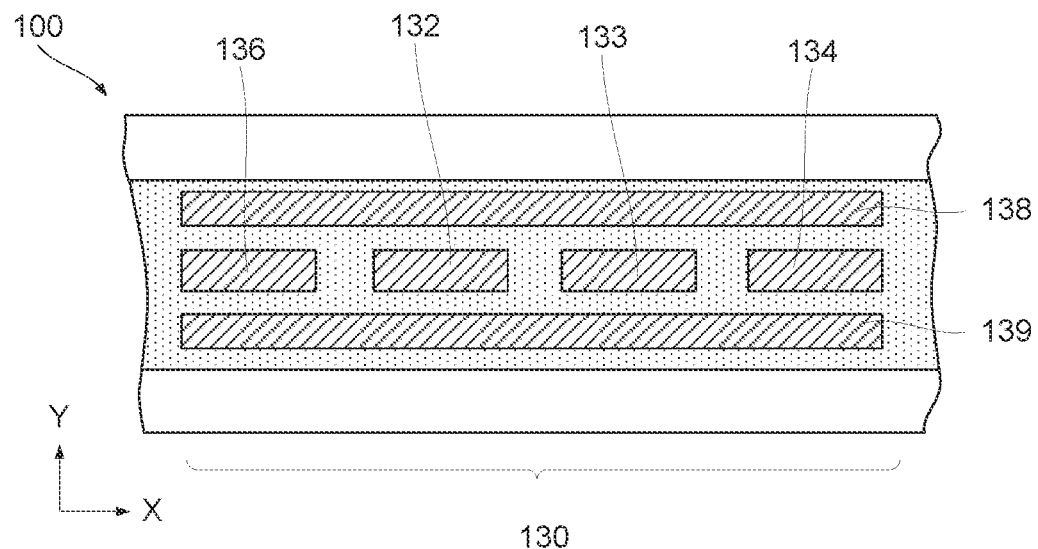
FIG. 8A and FIG. 8B illustrate examples of un-patterned shields in a flexible hybrid interconnect circuit.

An electromagnetic shield formed by conductive elements of flexible hybrid interconnect circuit 100 reduces and ultimately prevents low-frequency interference and radio frequency interference during the operation of flexible hybrid interconnect circuit 100. FIG. 8A illustrates a cross-sectional view of signal transmission portion 130 of flexible hybrid interconnect circuit 100. In this example, the electromagnetic shield is formed by first shield 134, second shield 136, third shield 138, and fourth shield 139. The electromagnetic shield partially encloses signal line 132 in this cross-sectional view. In other words, low and radio frequency interference to and from signal line 132 is mitigated by the electromagnetic shield within this cross-section (the X-Y plane).

In this example, the same electromagnetic shield also encloses additional signal line 133. This configuration may be used to create a differential signal pair, for example, which is well known for its ability to minimize electromagnetic (EM) coupling and radiation. In general, any number of signal lines may share the same overall shield. In some embodiments, an additional shield may be positioned between two signal lines.

Referring to FIG. 8A, each of first shield 134 and second shield 136 is disposed between third shield 138 and fourth shield 139 along the thickness of flexible hybrid interconnect circuit 100 (the Y direction in FIG. 2A). In other words, the projection of each of first shield 134 and second shield 136, along the thickness, fully or partially overlaps with each of third shield 138 and second shield 139.

Figure 8B:
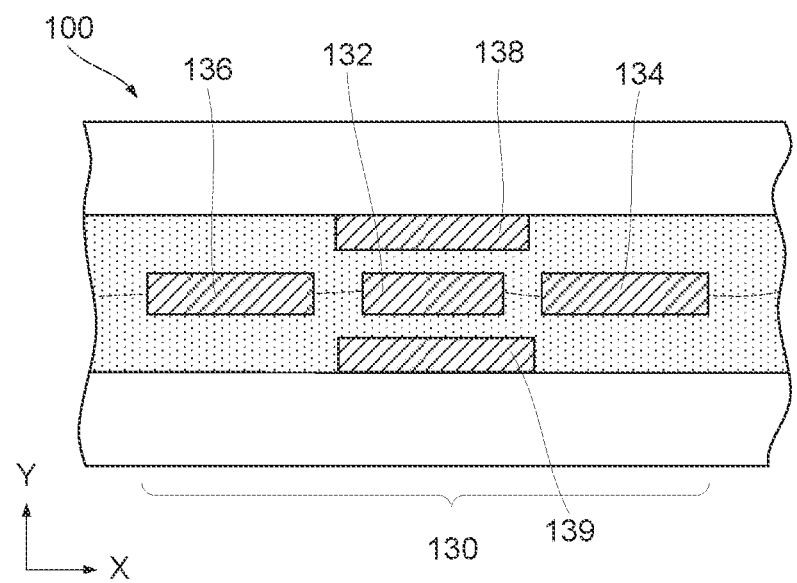

Alternatively, referring to FIG. 8B, first shield 134 and second shield 136 may be offset relative to third shield 138 and fourth shield 139 along the width of flexible hybrid interconnect circuit 100 (the X direction in FIG. 2A). In this example, the projections of first shield 134 and second shield 136, along the thickness, do not overlap with either third shield 138 or second shield 139.

In still other examples, first shield 134 and second shield 136 may not be present. The gap between third shield 138 and fourth shield 139 may be sufficiently small to provide sufficient shielding to signal line 132 positioned between third shield 138 and fourth shield 139.

The capacitance of signal transmission portion 130 is a function of the surface area between signal line 132 and surrounding shields. Decreasing the surface area of the shields in appropriate locations decreases the capacitance and increases the impedance. The impedance is a square root of the inductance divided by the capacitance. Matching the impedance of flexible hybrid interconnect circuit 100 with a receiving component avoids sending reflected waves back down signal line 132. For example, a single signal line may have an impedance of 50 Ohm, while a differential pair may have a differential impedance of 100-120 Ohm.

Figure 9A:
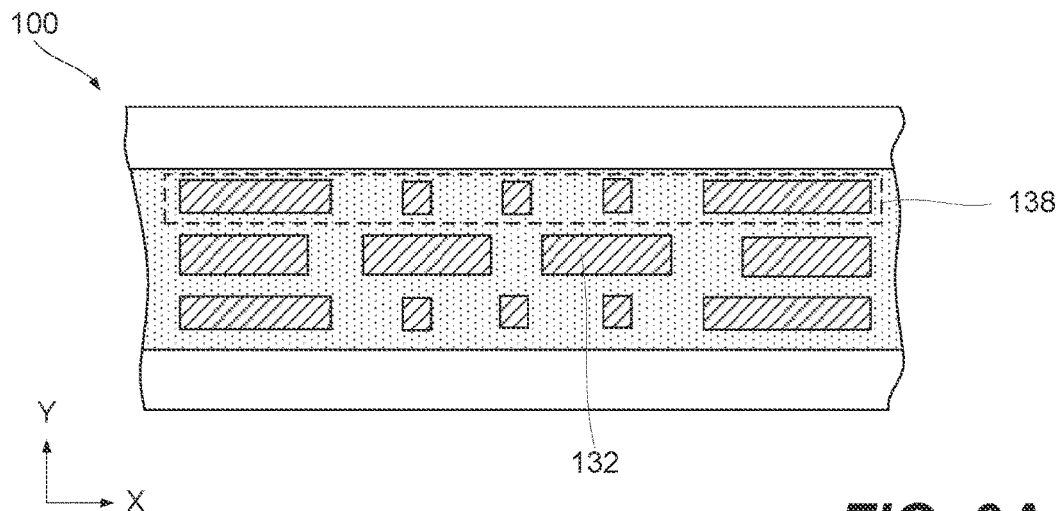
FIG. 9A and FIG. 9B illustrate examples of a patterned shield in a flexible hybrid interconnect circuit.
Figure 9B:
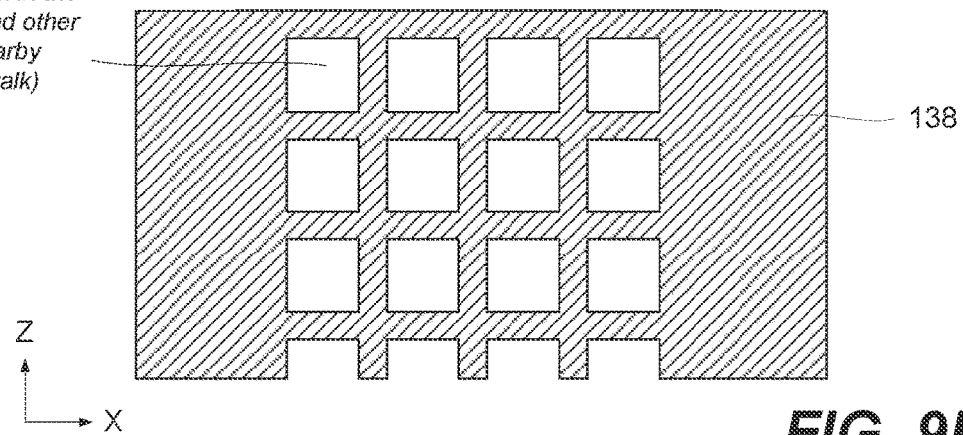

FIGS. 8A and 8B illustrate continuous shields without openings. In some alternative examples, one or more shields may have openings to change various characteristics of flexible hybrid interconnect circuit 100 or, more specifically, of signal transmission portion 130. Referring to FIGS. 9A and 9B, third shield 138 comprises an opening, having the size less than 1/10 the wavelength of the EM wave being transmitted down the signal line. In general, the size of openings in shields is less than the wavelengths of the signal carried by signal line 132 as well as wavelengths of potential external noise (blocking to prevent cross-talk).

Examples of Folding Flexible Hybrid Interconnect Circuits

Figure 10A:
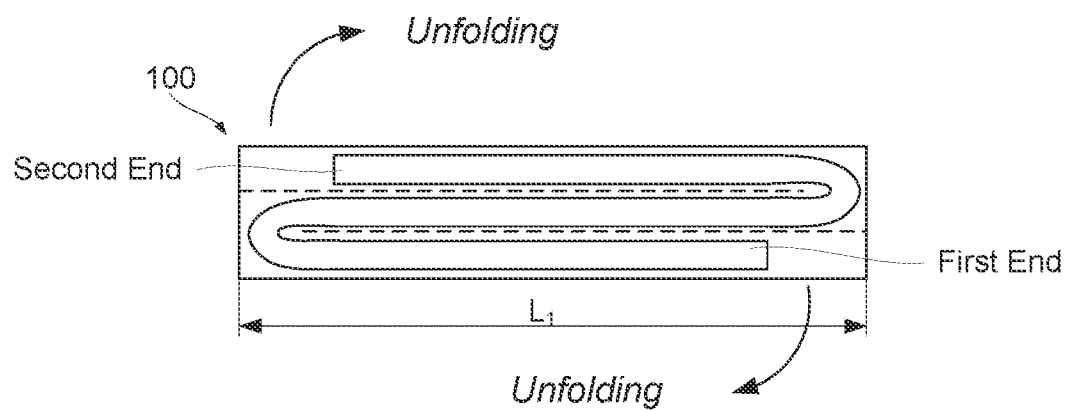
FIG. 10A and FIG. 10B illustrate an example of manufacturing a flexible hybrid interconnect circuit in a folded state and subsequent unfolding of the flexible hybrid interconnect circuit during installation of the circuit, in accordance with some examples.
Figure 10B:
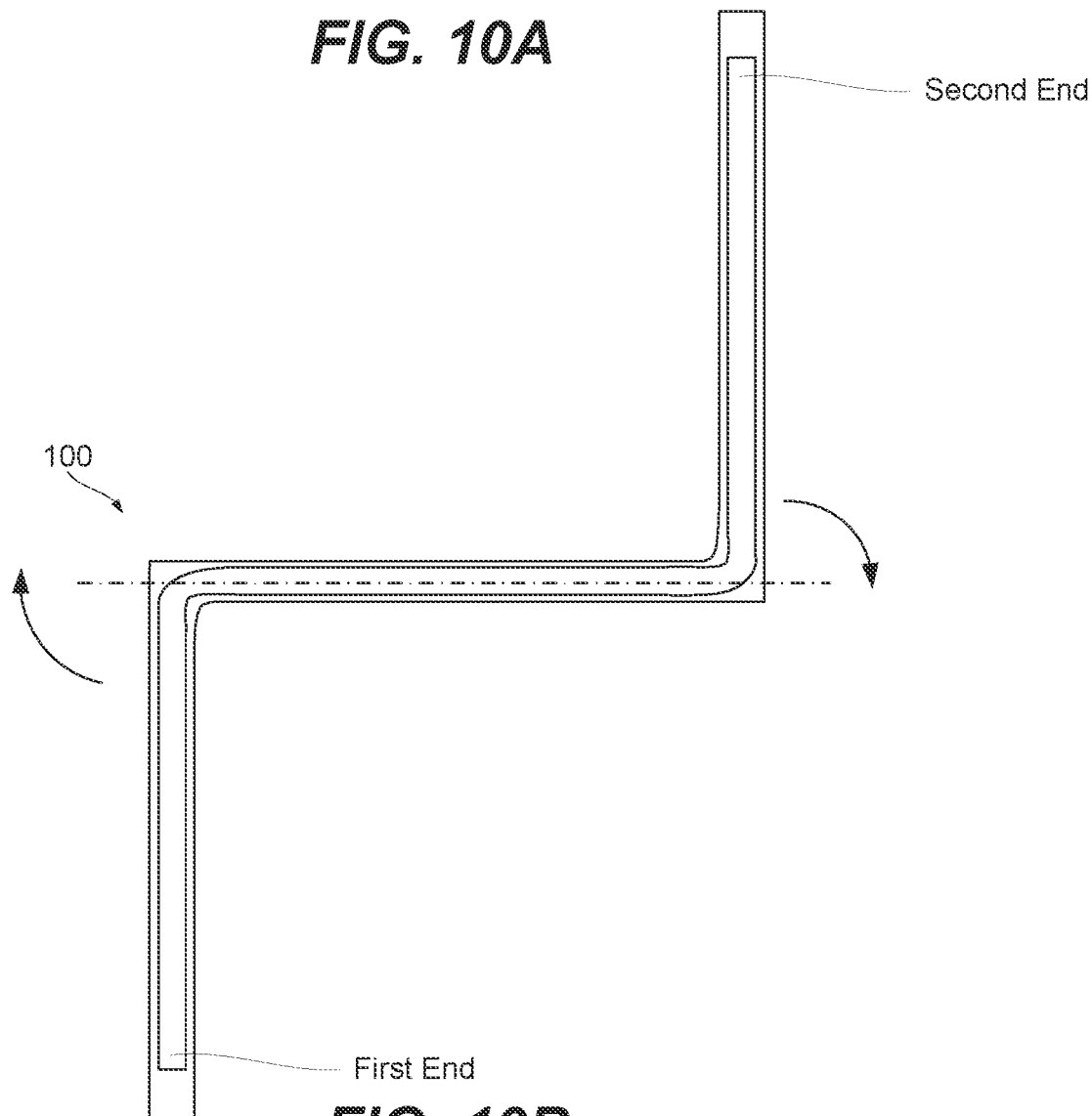

Flexible hybrid interconnect circuit 100 may be used for transmission of signals and electrical power between two distant locations. In some examples, the distance between two ends of flexible hybrid interconnect circuit 100 may be at least 1 meter or even at least 2 meters, even though the width may be relatively small, e.g., less than 100 millimeters and even less than 50 millimeters. At the same time, each conductive layer of flexible hybrid interconnect circuit 100 may be fabricated from a separate metal foil sheet. To minimize material consumption and reduce waste, the manufacturing footprint of flexible hybrid interconnect circuit 100 may be smaller than its operating footprint. The flexibility characteristic of flexible hybrid interconnect circuit 100 may be used to change its shape and position after its manufacturing and/or during its manufacturing. For example, flexible hybrid interconnect circuit 100 may be manufactured in a folded state as, for example, shown in FIG. 10A. The distance between the two ends and the overall length ($L_1$) of flexible hybrid interconnect circuit 100 in the folded state may be relatively small. FIG. 10B is a schematic illustration of the same flexible hybrid interconnect circuit 100 in a partially unfolded state, showing that the distance between the two ends and the length of flexible hybrid interconnect circuit 100 has substantially increased. One having ordinary skill in the art would understand that various folding patterns are within the scope.

Figure 10C:
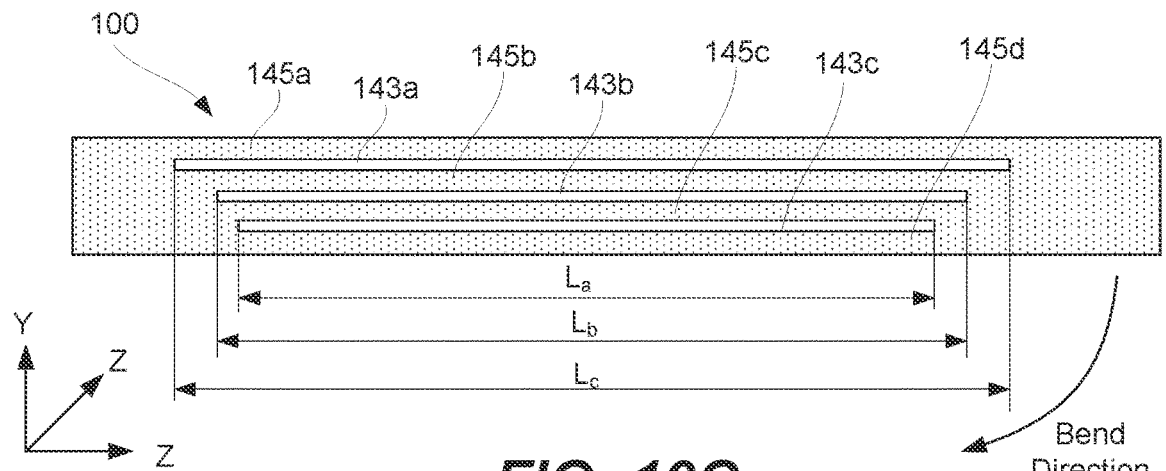
FIG. 10C illustrates a schematic top view of a flexible hybrid interconnect circuit comprising three openings in the circuit that divide the circuit into four circuit strips.
Figure 10D:
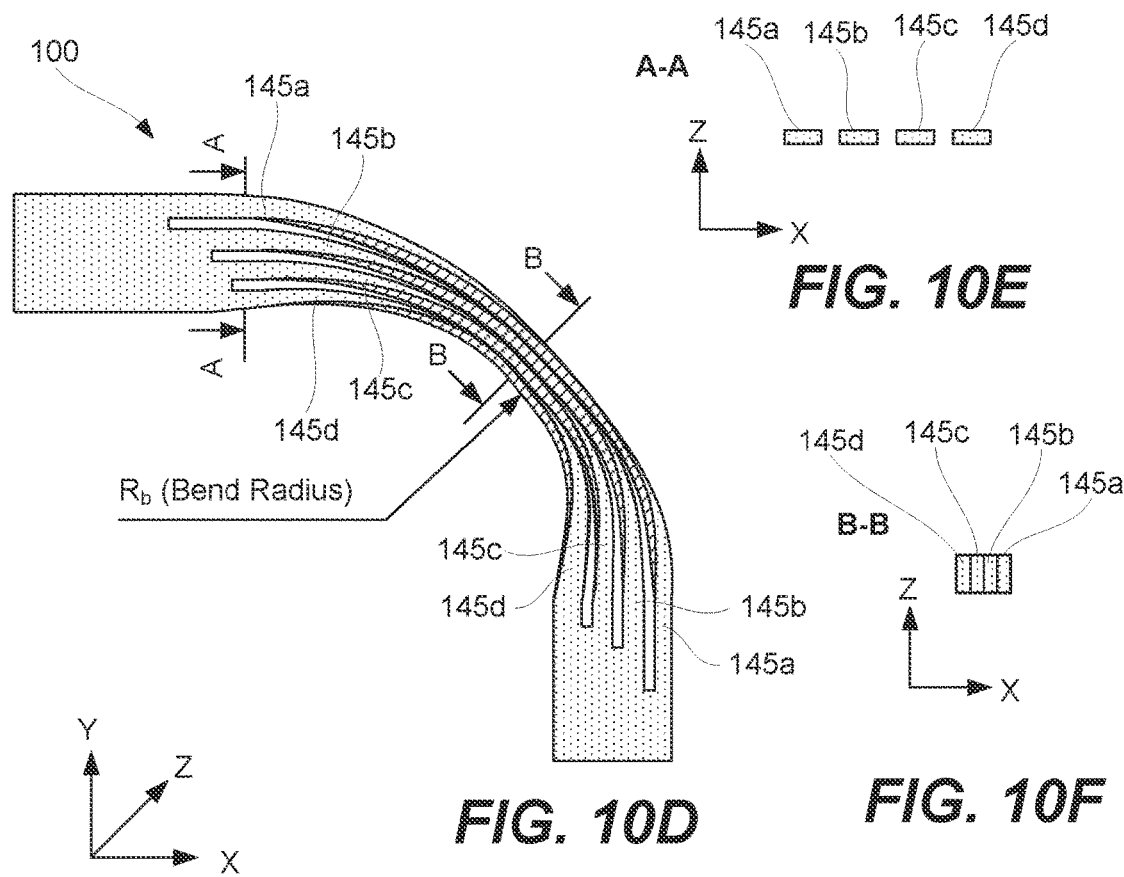
FIG. 10D illustrates a schematic top view of the flexible hybrid interconnect circuit shown in FIG. 10C with one end of the circuits turned 90° relative to the other end within a plane.
Figure 10E:
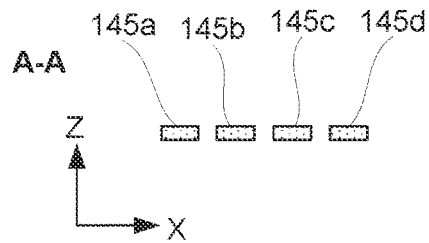
FIG. 10E and FIG. 10F illustrate schematic cross-section views of the insulator strips of the flexible hybrid interconnect circuit shown in FIG. 10C at different locations.
Figure 10F:
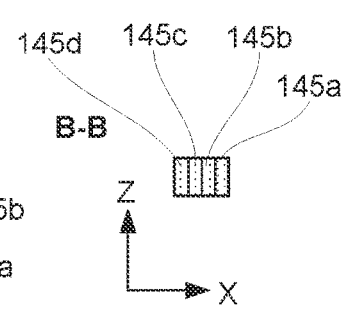

FIG. 10C illustrates flexible hybrid interconnect circuit 100 comprising openings 143a-143c that divide flexible hybrid interconnect circuit 100 into four strips 145a-145d. In some examples, each strip includes one or more conductor trace. FIG. 10D illustrates one end of flexible hybrid interconnect circuit 100 turned 90° relative to the other end within the X-Y plane, which may be referred to in-plane bending. Openings 143a-143c allow flexible hybrid interconnect circuit 100 to turn and bend without significant out of plane distortions of individual strips 145a-145d. One having ordinary skills in the art would understand that such bending would be difficult without openings 143a-143c because of the flat profile of flexible hybrid interconnect circuit 100 (small thickness in the Z direction) and the relatively low in-plane flexibility of materials forming flexible hybrid interconnect circuit 100. Adding openings 143a-143c allows different routing of each of strips 145a-145d, thereby increasing flexibility and decreasing the out of plane distortion. Furthermore, selecting a particular width and length of each opening allows for specific routing and orientation of each strip and flexible hybrid interconnect circuit 100. FIGS. 10E and 10F represent cross-sections of strips 145a-145d at different locations of flexible hybrid interconnect circuit 100. As shown in these figures, strips 145a-145d may be brought closer together and rotated 90° around each of their respective center axes at some point (B-B) in the bend. To achieve this type of orientation, the length of each opening may be different or staggered as, for example, shown in FIG. 10C.

Figure 10G:
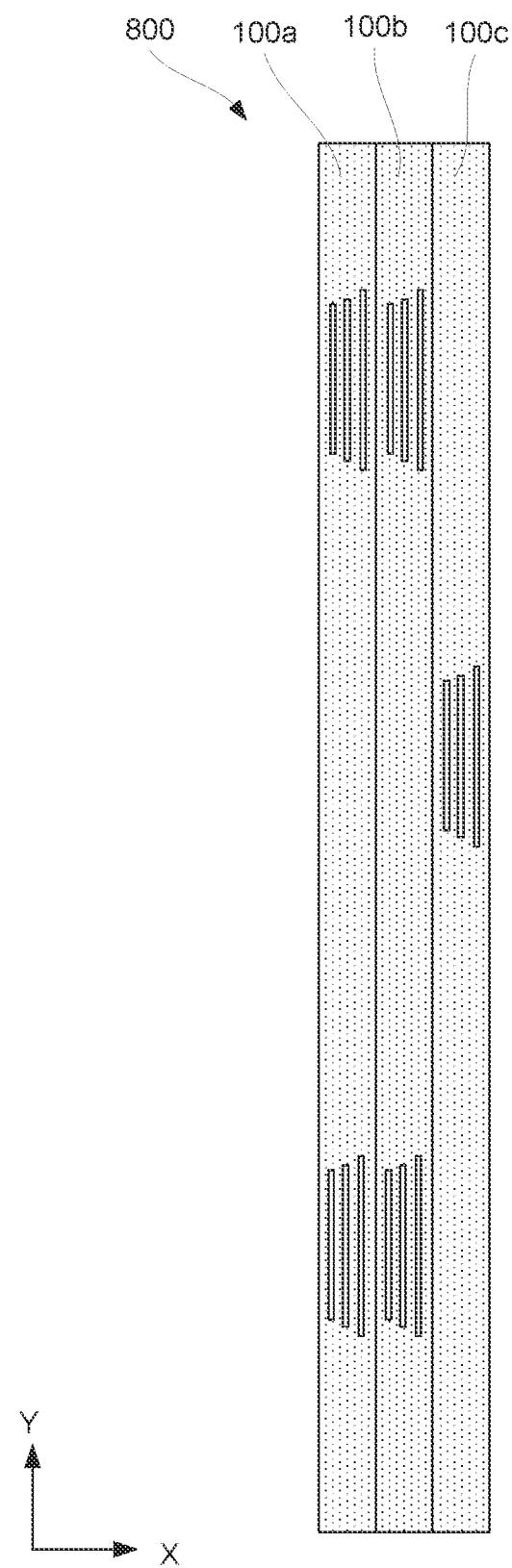
FIG. 10G illustrates an example of a production assembly comprising multiple flexible hybrid interconnect circuits, temporarily joined together.

FIG. 10G illustrates an example of production assembly 800 of multiple flexible hybrid interconnect circuits 100a-100c. In some examples, flexible hybrid interconnect circuits 100a-100c are partially integrated, e.g., supported on the same releasable line or have one monolithic outer dielectric layer, which is partially cut (e.g., scored). This partial integration feature allows keeping flexible hybrid interconnect circuits 100a-100c together during fabrication and storage, e.g., up to the final use of flexible hybrid interconnect circuits 100a-100c.

Furthermore, in this example, flexible hybrid interconnect circuits 100a-100c are formed in a linear form, e.g., to reduce material waste and streamline processing. Each of flexible hybrid interconnect circuits 100a-100c is separable from assembly 800 and is foldable into its operating shape, as for example is described above with reference to FIGS. 10C-10F.

Figure 10H:
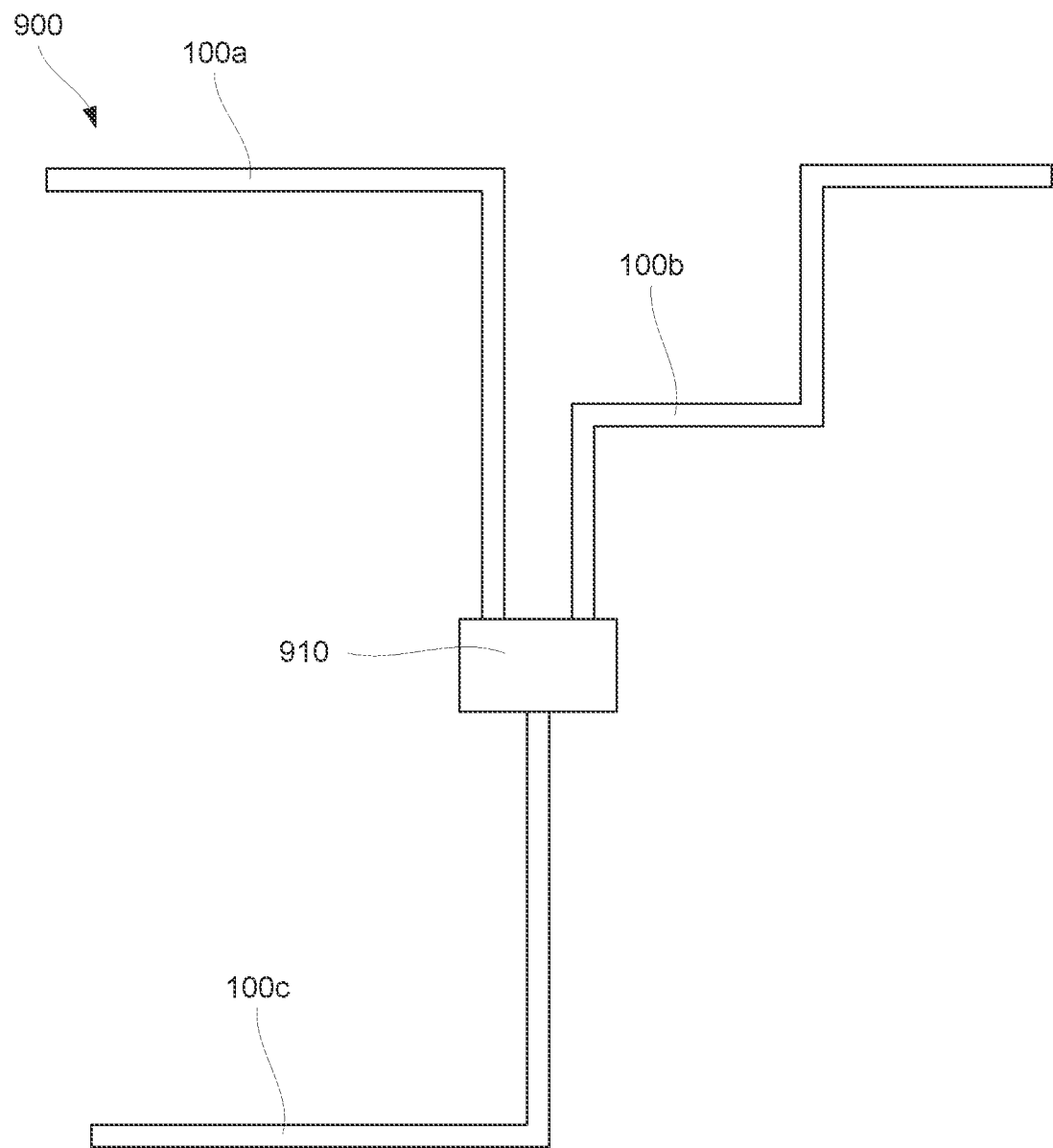
FIG. 10H illustrates of an example of an interconnect assembly comprising an interconnect hub and multiple flexible hybrid interconnect circuits connected to the interconnect hub.

FIG. 10H illustrates an example of interconnect assembly 900 comprising flexible hybrid interconnect circuits 100a-100c and interconnect hub 910. In some examples, each of flexible hybrid interconnect circuits 100a-100c is manufactured in a linear form as, for example, described above with reference to FIG. 10G. The bends in flexible hybrid interconnect circuits 100a-100c are formed during the installation of flexible hybrid interconnect circuits 100a-100c (e.g., lamination of a supporting structure such as a car panel). Interconnect hub 910 forms electrical connections between individual conductive elements in flexible hybrid interconnect circuits 100a-100c. These electrical connections are provided by conductive elements of interconnect hub 910 positioned on one level or multiple levels (e.g., for crossover connections). Furthermore, the conductive elements of interconnect hub 910 and the conductive elements of flexible hybrid interconnect circuits 100a-100c are either within the same plane or in different planes.

Figure 10I:
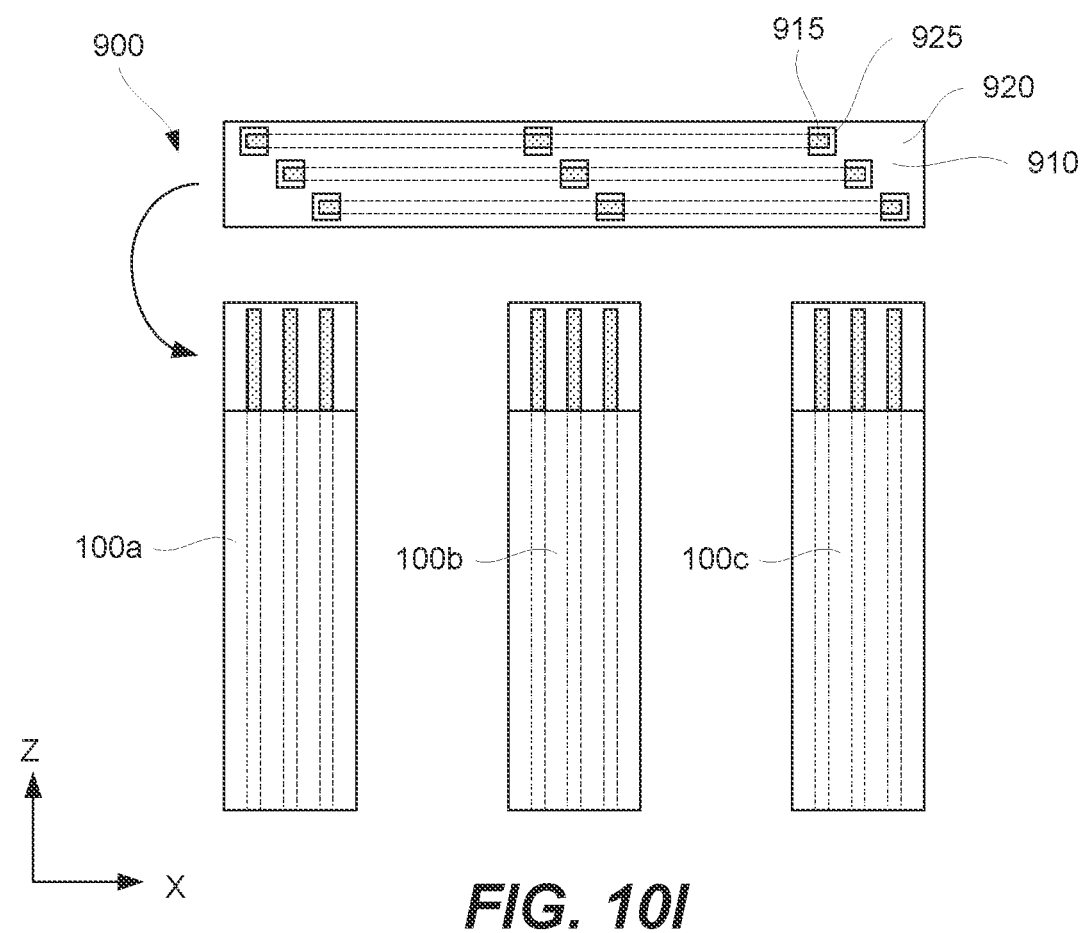
FIG. 10I and FIG. 10J illustrate examples of an interconnect assembly before and after attaching an interconnect hub to three flexible hybrid interconnect circuits.
Figure 10J:
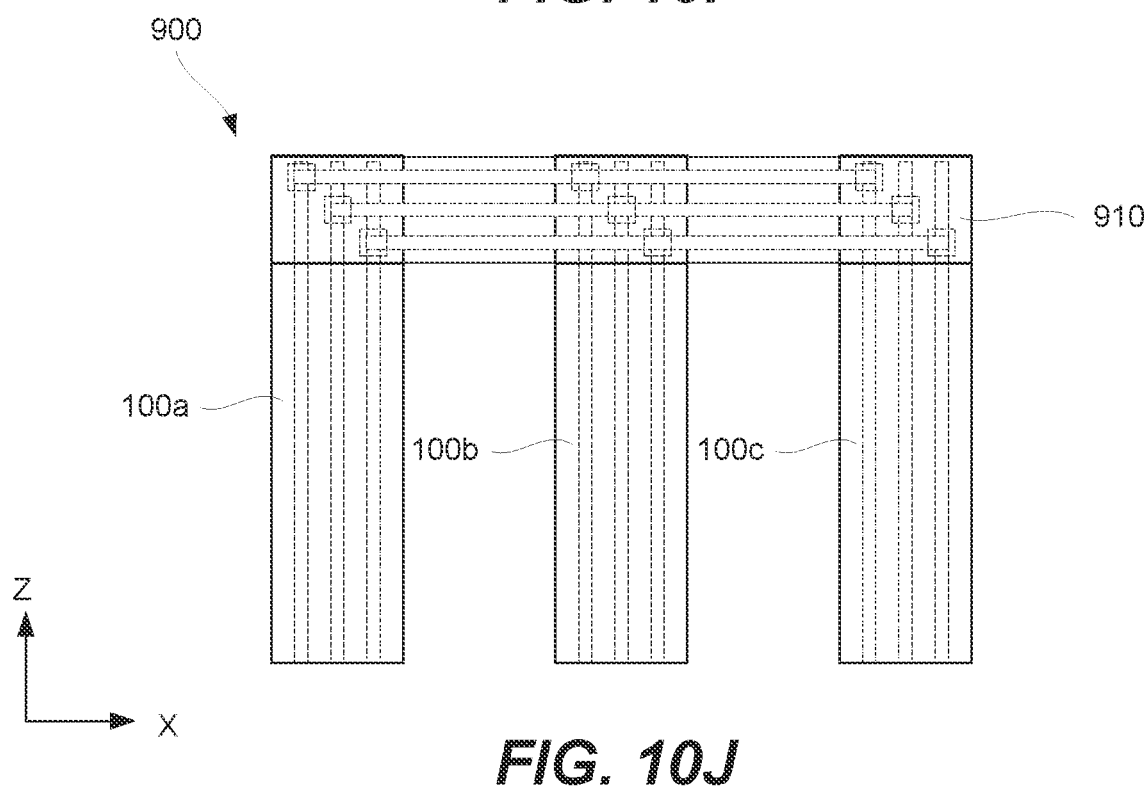

Specifically, FIG. 10I is an example of interconnect assembly 900 prior to attaching interconnect hub 910 to flexible hybrid interconnect circuits 100a-100c. Interconnect hub 910 comprises dielectric layer 920 and conductive elements 915, which are partially insulated by dielectric layer 920. Furthermore, dielectric layer 920 comprises openings 925, partially exposing conductive elements 915 of interconnect hub 910 as shown in FIG. 10I. Conductive elements 915 and openings 925 are patterned according to desired connections between flexible hybrid interconnect circuits 100a-100c. The example of interconnect hub 910, shown in FIG. 10I, is designed for interconnecting all left-most conductive elements of flexible hybrid interconnect circuits 100a-100c, separately interconnecting all middle conductive elements of flexible hybrid interconnect circuits 100a-100c, and separately interconnecting all rightmost conductive elements of flexible hybrid interconnect circuits 100a-100c. FIG. 10J shows interconnect assembly 900 of FIG. 10I after attaching interconnect hub 910 to flexible hybrid interconnect circuits 100a-100c.

Figure 10K:
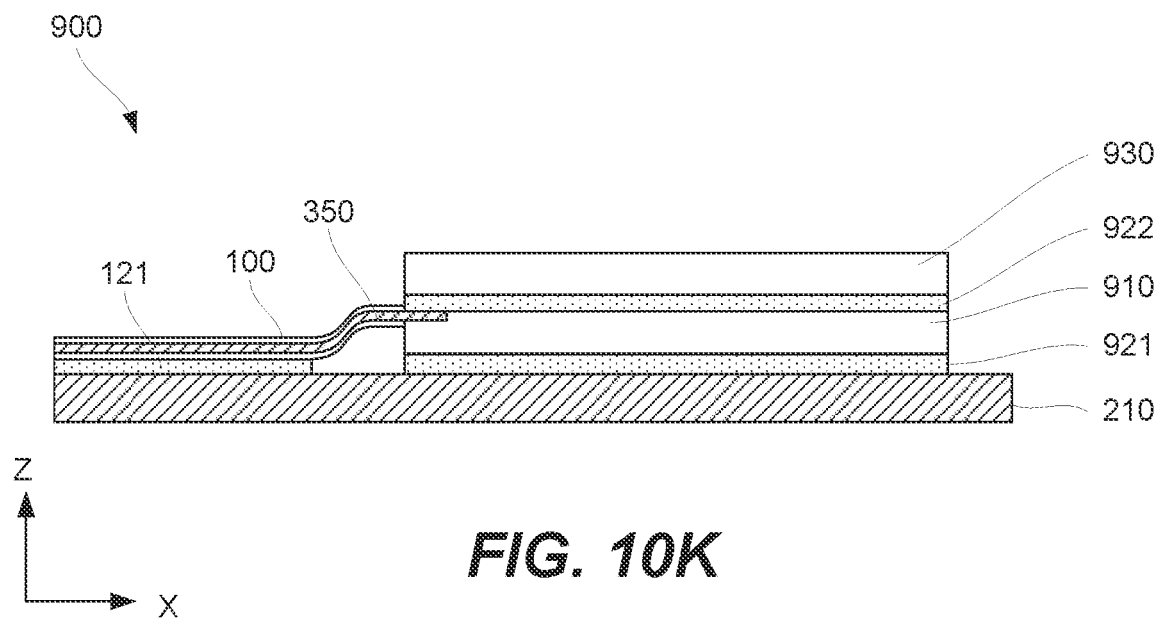
FIG. 10K illustrates a side cross-sectional view of an interconnect hub, mounted to a body panel and connected to a flexible hybrid interconnect circuit, in accordance with some examples.

FIG. 10K illustrates a side cross-sectional view of interconnect assembly 900 comprising interconnect hub 910, mounted to body panel 210 and connected to flexible hybrid interconnect circuit 100, in accordance with some examples. Specifically, interconnect hub 910 is mounted to body panel 210 using hub mounting adhesive 921, such as an adhesive tape or, more specifically, a very high bonding (VHB) tape or an ultra-high bonding (UHB) tape. In some examples, hub mounting adhesive 921 comprises a polyethylene liner and an acrylic adhesive, disposed on the liner. Other materials are also within the scope.

Interconnect assembly 900 also comprises hub cover plate 930, which is mounted to interconnect hub 910 using plate mounting adhesive 922. In some examples, plate mounting adhesive 922 is the same as hub mounting adhesive 921. Alternatively, plate mounting adhesive 922 is different from hub mounting adhesive 921. For example, plate mounting adhesive 922 is an adhesive tape or, more specifically, very high bonding (VHB) tape or ultra-high bonding (UHB) tape. In some examples, plate mounting adhesive 922 comprises a polyethylene liner and an acrylic adhesive disposed on the liner. Other materials are also within the scope.

Hub cover plate 930 provides mechanical support and strain relief to electrical connections between interconnect hub 910 and interconnect circuit 100. In some examples, plate mounting adhesive 922 is in direct contact with interconnect circuit 100 or, more specifically, with conductive elements of interconnect circuit 100. As such, any strain applied between interconnect hub 910 and interconnect circuit 100 is transferred by plate mounting adhesive 922 to hub cover plate 930, thereby reducing the strain on the electrical connections between interconnect hub 910 and interconnect circuit 100. In some examples, hub cover plate 930 is formed from a rigid plastic, a composite material (e.g., glass-reinforced epoxy laminate), or the like.

Examples of Conductive Tabs and Forming Electrical Connections

Referring to FIGS. 11A-11C, external connections to conductive elements arranged into a stack and/or connections between these conductive elements may be formed using tabs of these elements that protrude away from boundaries (edges) of the stack. Specifically, FIG. 11A is a schematic perspective view of flexible hybrid interconnect circuit 100 comprising first conductive element 350, second conductive element 360, and third conductive element 370, forming a stack along the thickness of flexible hybrid interconnect circuit 100. Each of first conductive element 350, second conductive element 360, and third conductive element 370 may represent any one of the shields, signal lines, and/or power conductors discussed above with reference to FIG. 2A and other figures.

Referring to FIG. 11A, first conductive element 350 comprises first tab 352, second conductive element 360 comprises second tab 362, and third conductive element 370 comprises third tab 372. Each of first tab 352, second tab 362, and third tab 372 extends along the length of flexible hybrid interconnect circuit 100 and outside of the stack boundaries. FIG. 11B is a schematic top view of another example of flexible hybrid interconnect circuit 100, in which first tab 352 and third tab 372 also flare of along the width of flexible hybrid interconnect circuit 100 to provide more spacing among these tabs. FIG. 11C is a schematic top view of yet another example of flexible hybrid interconnect circuit 100, in which first tab 352, second tab 362, and third tab 372 extend along the width of flexible hybrid interconnect circuit 100 and outside of the stack boundaries. In this example, first tab 352, second tab 362, and third tab 372 are also offset along the length of flexible hybrid interconnect circuit 100.

Figure 11D:
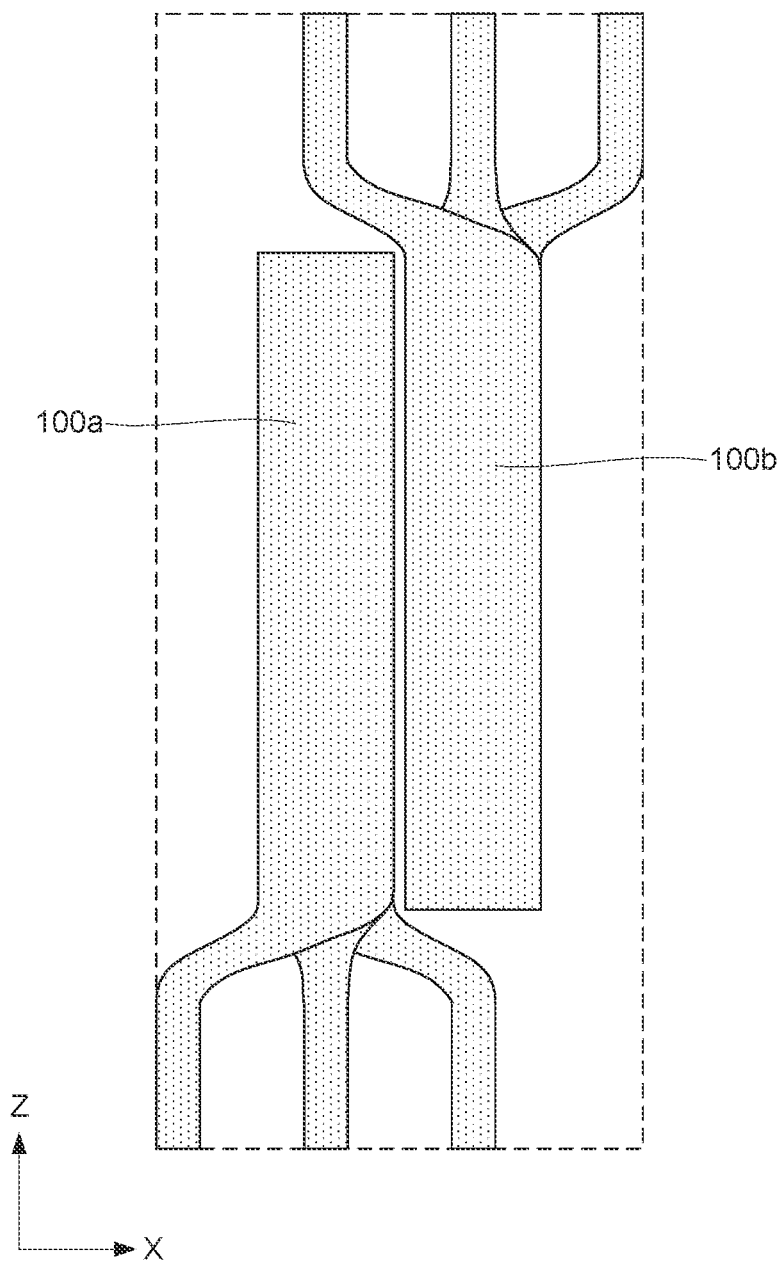

FIG. 11D is a schematic top view of two flexible hybrid interconnect circuits 100a and 100b, showing their orientation during production. The dashed line represents the footprint of both circuits, which corresponds to the material for each layer. This orientation of two flexible hybrid interconnect circuits 100a and 100b allows minimizing material waste, while forming multiple flexible hybrid interconnect circuits in parallel.

Figures 11E, 11F:
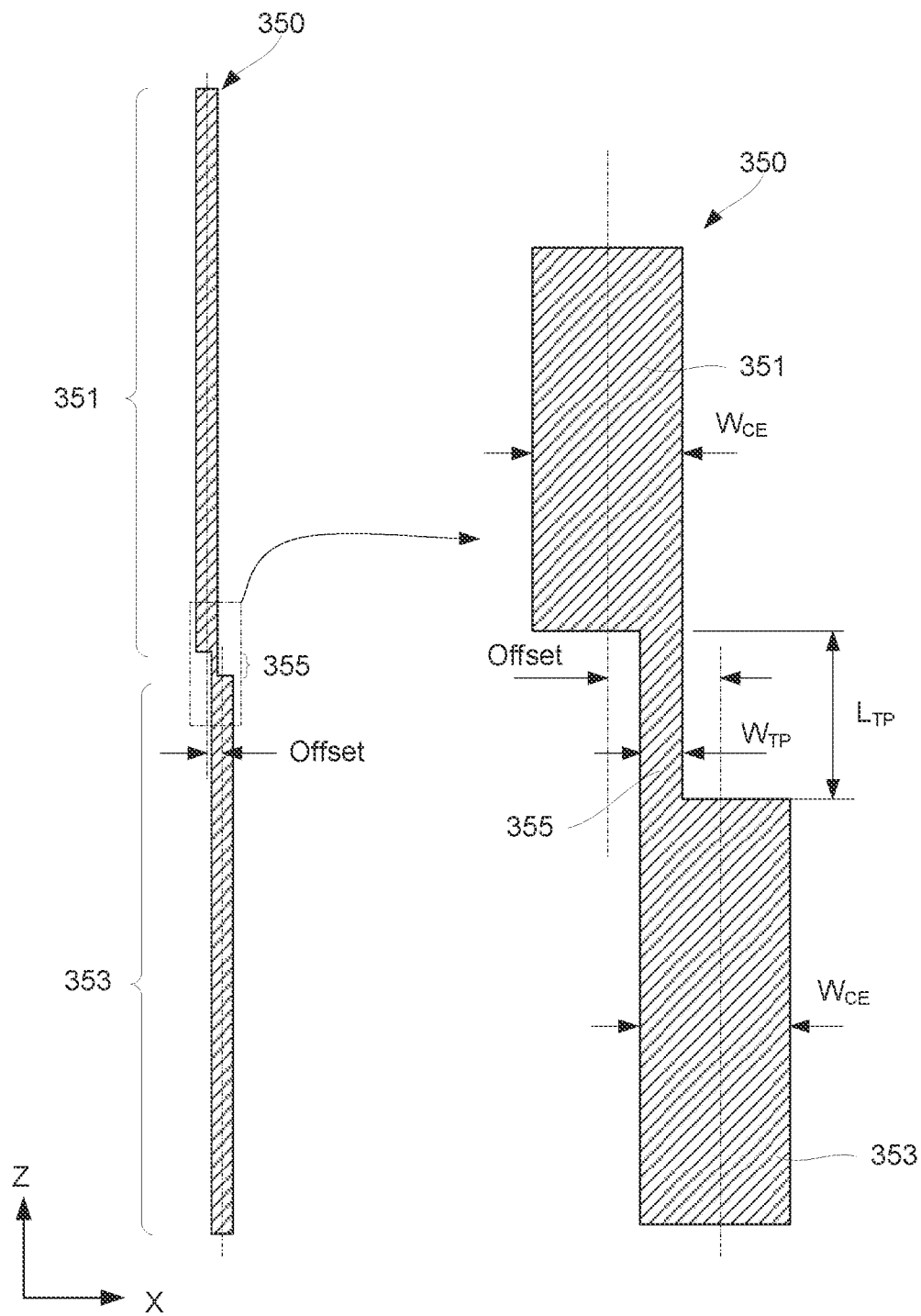
FIG. 11E and FIG. 11F are top schematic views of a conductive element with two portions offset relative to each other and interconnected by a transition portion, in accordance with some examples.

FIG. 11E and FIG. 11F are schematic top views of conductive element 350, comprising first conductive element portion 351, second conductive element portion 353, and transition portion 355, in accordance with some examples. Specifically, FIG. 11F is an expanded view of a part of conductive element 350 around transition portion 355. Transition portion 355 is monolithic with and interconnects first conductive element portion 351 and second conductive element portion 353. At the same time, transition portion 355 has a narrower width ($W_{TP}$) than the width ($W_{CE}$) of either first conductive element portion 351 or second conductive element portion 353, which may be collectively referred to as the conductive element width ($W_{CE}$). In some examples, first conductive element portion 351 and second conductive element portion 353 have the same width ($W_{CE}$). Furthermore, first conductive element portion 351 and second conductive element portion 353 are offset relative to each as shown in FIG. 11E and FIG. 11F.

In some examples, transition portion 355 is operable as an electrical fuse, protecting other conductive components of flexible hybrid interconnect circuit 100 and components to which flexible hybrid interconnect circuit 100 is connected to. The fusing characteristics of transition portion 355 depend on its width ($W_{TP}$) and its length ($L_{TP}$). The width ($W_{TP}$) of transition portion 355, in turn, depends on the offset and the width ($W_{CE}$) of either first conductive element portion 351 or second conductive element portion 353 (e.g., $W_{TP}=W_{CE}$-Offset). In some examples, the width ($W_{TP}$) of transition portion 355 is between 5% and 50% of the conductive element width ($W_{CE}$) or, more specifically, between 10% and 30% of the conductive element width ($W_{CE}$). The length ($L_{TP}$) of transition portion 355 may be between 10 micrometers and 700 micrometers or, more specifically, between 50 micrometers and 500 micrometers or even between 100 micrometers and 400 micrometers.

Figure 12A:
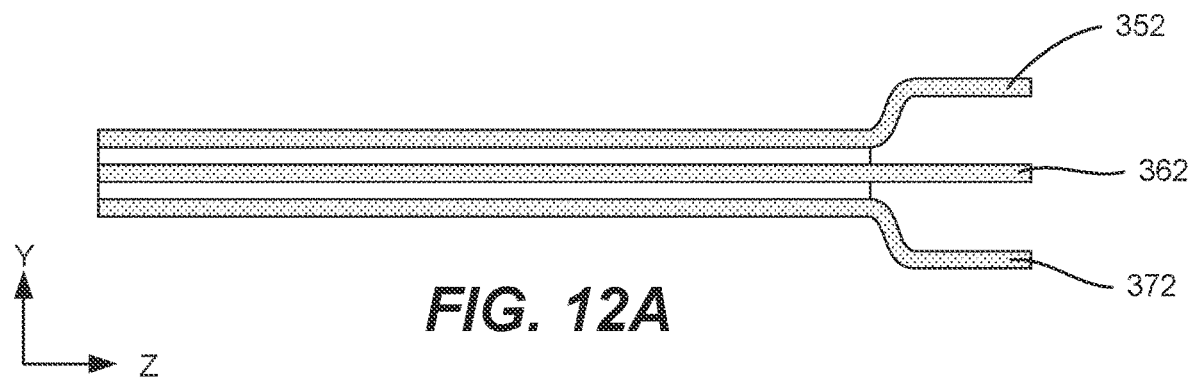
FIG. 12A-FIG. 12C illustrate different examples of electrical connections, among conductive elements of a flexible hybrid interconnect circuit, the electrical connection formed using tabs of these conductive elements.

FIG. 12A is a schematic side view of flexible hybrid interconnect circuit 100, in which first tab 352 and third tab 372 flare in the direction of the thickness of flexible hybrid interconnect circuit 100 to provide more spacing among the tabs. It should be noted that this example can be combined with any other examples described above with reference to FIGS. 7A-7C.

Figure 12B:
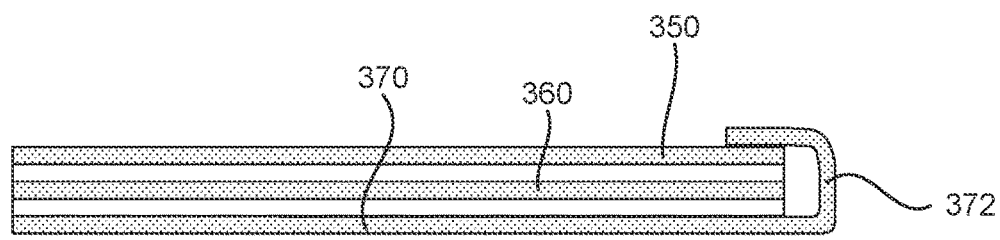
Figure 12C:
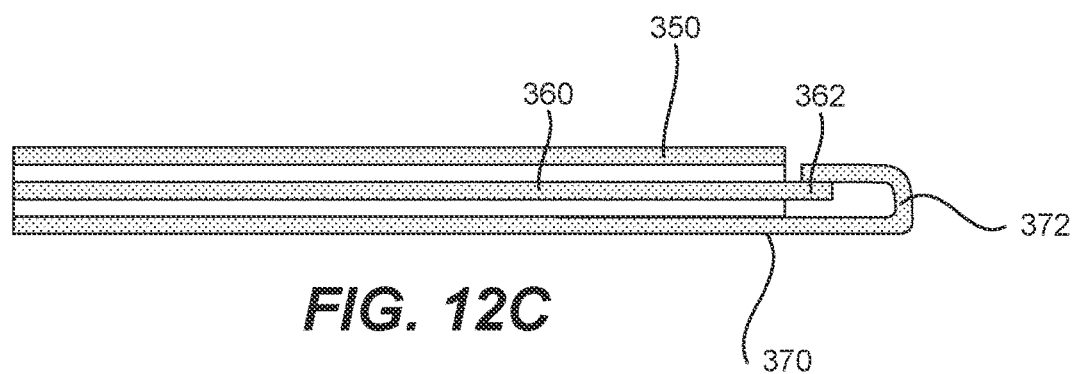

FIG. 12B is a side schematic view of flexible hybrid interconnect circuit 100, showing third tab 372 making a direct electrical connection to first conductive element 350. FIG. 12C is a side schematic view of flexible hybrid interconnect circuit 100, showing third tab 372 making a direct electrical connection to second tab 362.

Processing Examples

Figure 13A:
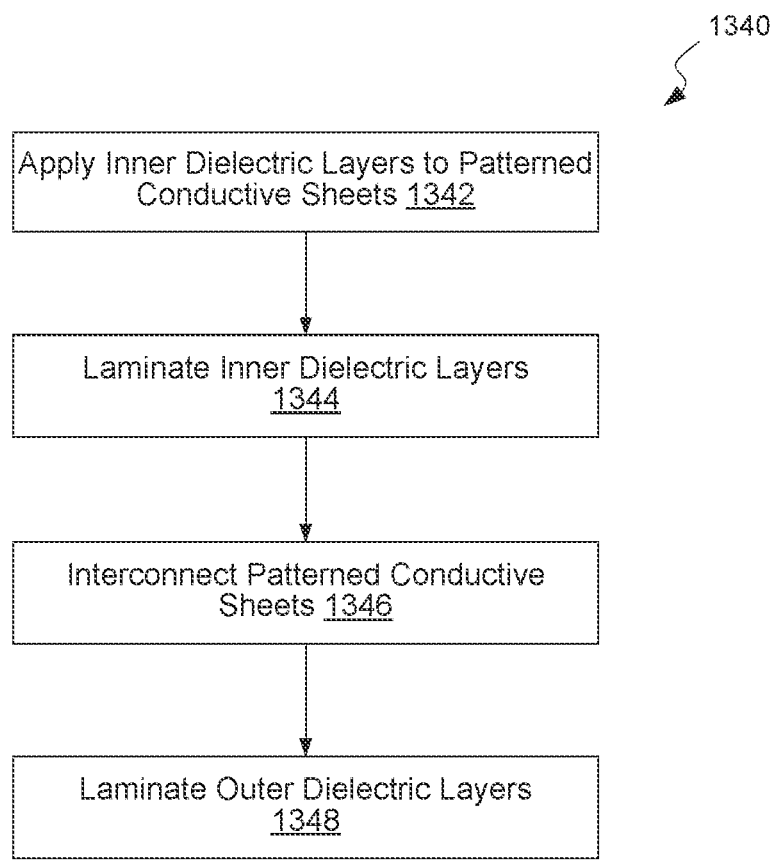
FIG. 13A is a process flowchart, corresponding to laminating patterned conductive sheets to inner and outer dielectrics, in accordance with some examples.
Figure 13B:
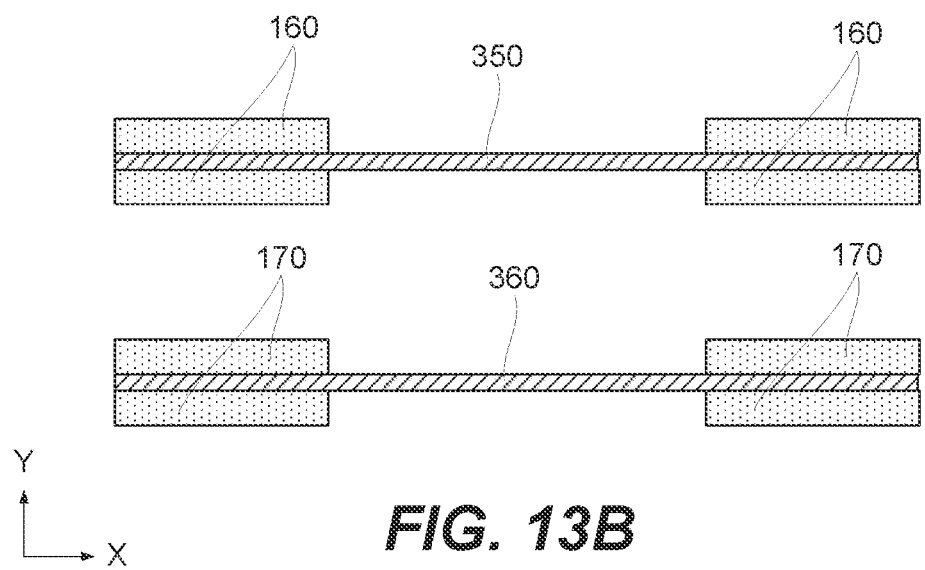
FIG. 13B-FIG. 13E are schematic illustrations of various stages during lamination of the patterned conductive sheets to the inner and outer dielectrics, in accordance with some examples.

FIG. 13A is a process flowchart corresponding to method 1340 of laminating patterned conductive sheets to inner and outer dielectrics. Method 1340 may involve applying inner dielectrics to patterned conductive sheets (block 1342). More specifically, an inner dielectric is applied to a portion of at least one conductive sheet, while another portion remains exposed and free from the inner dielectric. FIG. 13B is a schematic illustration of first inner dielectric 160 applied to a portion of first conductive element 350 with first inner dielectric 160 and, separately, second inner dielectric 170 applied to a portion of second conductive element 360 with first inner dielectric 160. In this example, first conductive element 350 is a part of one patterned conductive sheet, while second conductive element 360 is a part of a different patterned conductive sheet. In some examples, only one conductive element receives an inner dielectric, while another conductive element remains free from any inner dielectrics.

Figure 13C:
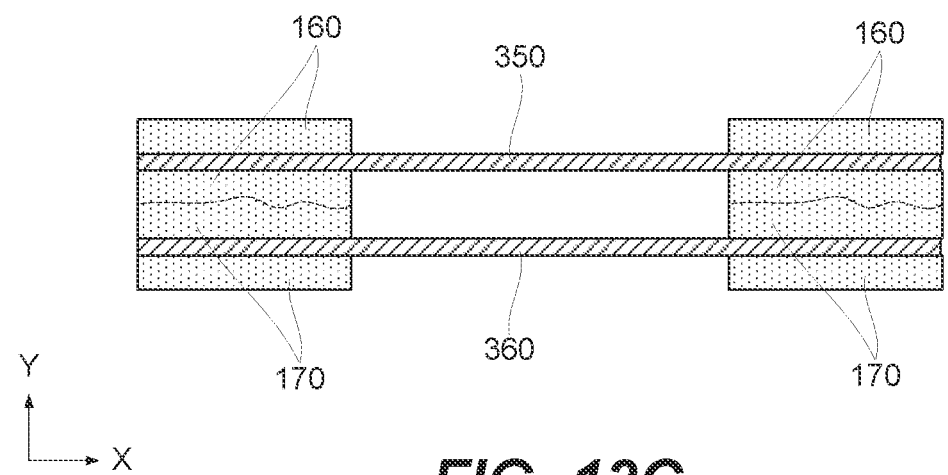

Referring to FIG. 13A, method 1340 proceeds with laminating the inner dielectrics, previously applied to the patterned conductive sheets, to each other (block 1344). FIG. 13C is a schematic illustration of first inner dielectric 160 laminated to second inner dielectric 170. Portions of first conductive element 350 and second conductive element 360, which are free from inner dielectrics, are aligned, which allows forming a direct contact between these portions in future operations. When only one patterned conductive sheet has an applied inner dielectric, this inner dielectric is laminated directly to another patterned conductive sheet.

Figure 13D:
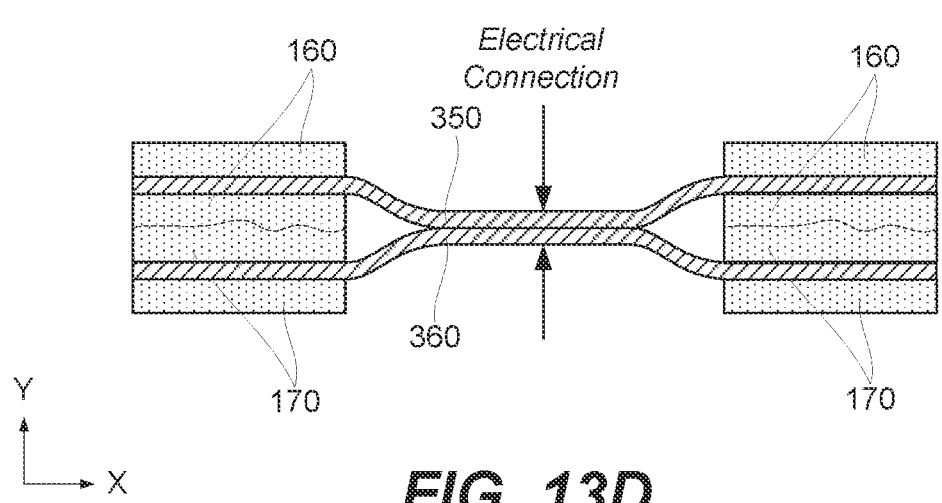

Referring to FIG. 13A, method 1340 proceeds with interconnecting the patterned conductive sheets to each other (block 1346). After this operation, the patterned conductive sheets or, more specifically, individual conductive elements of the patterned conductive sheets are electrically connected. FIG. 13D is a schematic illustration of first conductive element 350 and second conductive element 360 connected to each other. This connection may involve welding, soldering, mechanical crimping, forming conductive adhesive bonds, and the like.

Figure 13E:
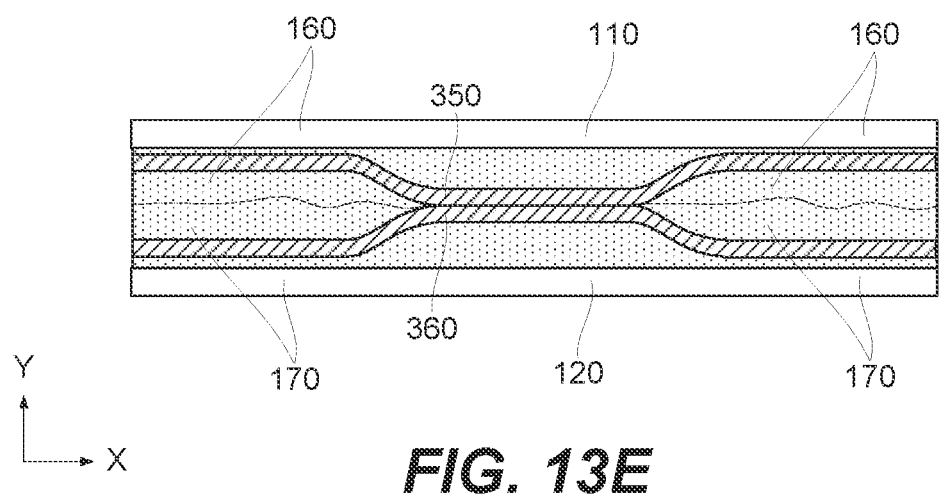

Referring to FIG. 13A, method 1340 proceeds with laminating outer dielectrics (block 1348). The outer dielectrics are laminated to a stack comprising one or more inner dielectrics and two or more patterned conductive sheets, connected to each other. This operation also involves the redistribution of the inner dielectrics to fill various voids within this assembly. FIG. 13E is a schematic illustration of this assembly showing first outer dielectric 110 and second outer dielectric 120 laminated to first inner dielectric 160, first conductive element 350, second conductive element 360, and second inner dielectric 170.

Programmable Interconnect Hub Examples

Figure 14A:
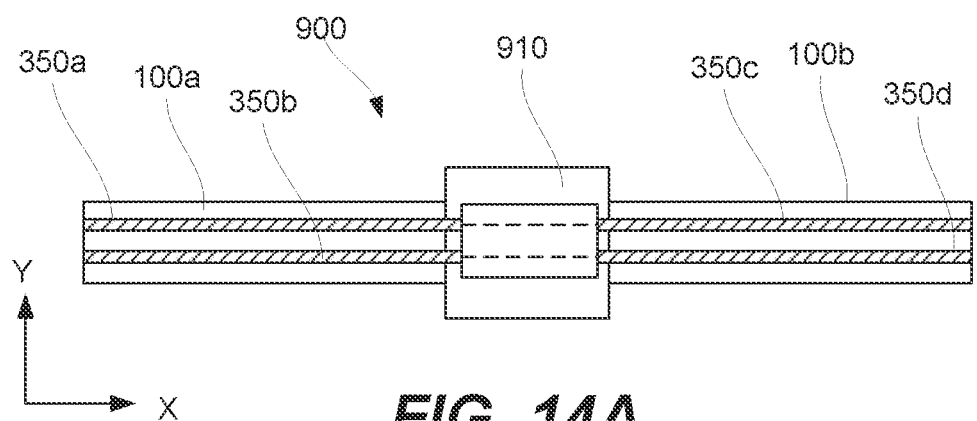
FIGS. 14A and 14B are schematic illustrations of two different electrical connections provided by a programmable interconnect hub to the same set of conductive elements of the two flexible hybrid interconnect circuits, in accordance with some examples.
Figure 14B:
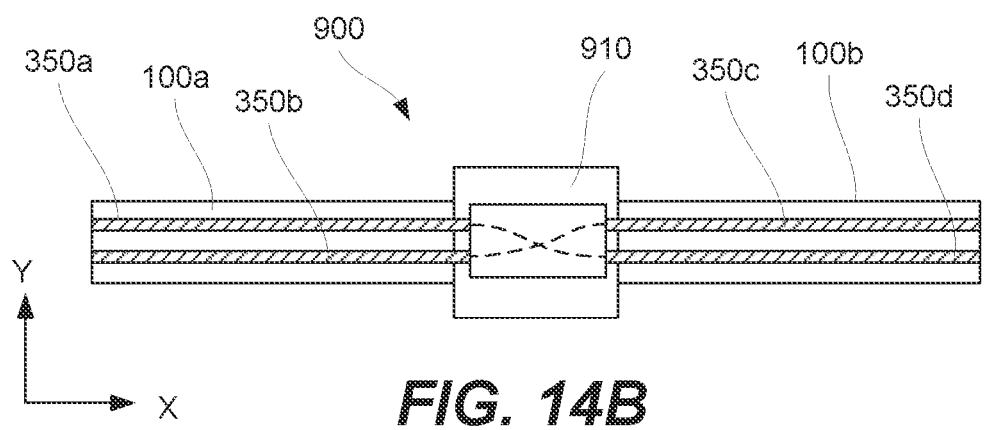

FIGS. 14A and 14B illustrate interconnect assembly 900 at two different operating stages. Interconnect assembly 900 comprises first interconnect circuit 100a and second interconnect circuit 100b, coupled to interconnect hub 910, which is programmable. For example, interconnect hub 910 may comprise a field programmable gate array (FPGA), a controller, a computer chip, or the like. A programmable interconnect hub allows changing connections within interconnect assembly 900 (e.g., between first interconnect circuit 100a and second interconnect circuit 100b), thereby providing additional configurations and ultimately using the same interconnect assembly for different types of connections and applications (aka "one size fits all" approach). For example, interconnect assembly 900 may be a wire harness for a vehicle. The same interconnect assembly 900 may be used for different configurations of the vehicle with the programming of interconnect hub 910 addressing differences in configurations or, more specifically, different electrical and signal connections needed as a result of these configuration differences.

In some examples, interconnect hub 910 is programmed to connect power, ground, and data traces from the in-line to the various modules. As the modules are changed from one vehicle model to another, interconnect hub 910 is reprogrammed to change the output definition of interconnect hub 910, but the same interconnect hub 910 can be used across the entire vehicle fleet, despite differences in model configurations.

Furthermore, interconnect hub 910 may be programmed to provide a remote disconnect feature. For example, if a conductive element of the circuit stops working (e.g., due to a short, break, or other reason), the faulty conductive element may be disconnected at interconnect hub 910. A different line may be selected by interconnect hub 910 to perform the function of the faulty conductive element. Finally, interconnect hub 910 may be reprogrammed during its use (e.g., changing from one operation to another and so on).

Referring to FIGS. 14A and 14B, first interconnect circuit 100a comprises first conductive element 350a and second conductive element 350b. Second interconnect circuit 100b comprises third conductive element 350c and fourth conductive element 350d. In this simplified example, interconnect hub 910 is programmable allowing to change connections among first conductive element 350a, second conductive element 350b, third conductive element 350c, and fourth conductive element 350d. FIG. 14A illustrates an operating stage, where interconnect hub 910 connects first conductive element 350a of first interconnect circuit 100a with third conductive element 350c of second conductive element 350b, and separately, second conductive element 350b of first interconnect circuit 100a with fourth conductive element 350d of second conductive element 350b. FIG. 14B illustrates a different operating stage, where interconnect hub 910 connects first conductive element 350a of first interconnect circuit 100a with fourth conductive element 350d of second conductive element 350b, and separately, second conductive element 350b of first interconnect circuit 100a with third conductive element 350c of second conductive element 350b. Interconnect hub 910 may be programmed to switch between these operating stages. In some examples, one or more of the conductive elements connected to interconnect hub 910 may be used for programming interconnect hub 910. In other words, programming of interconnect hub 910 may be performed through interconnect assembly 900.

Figure 14C:
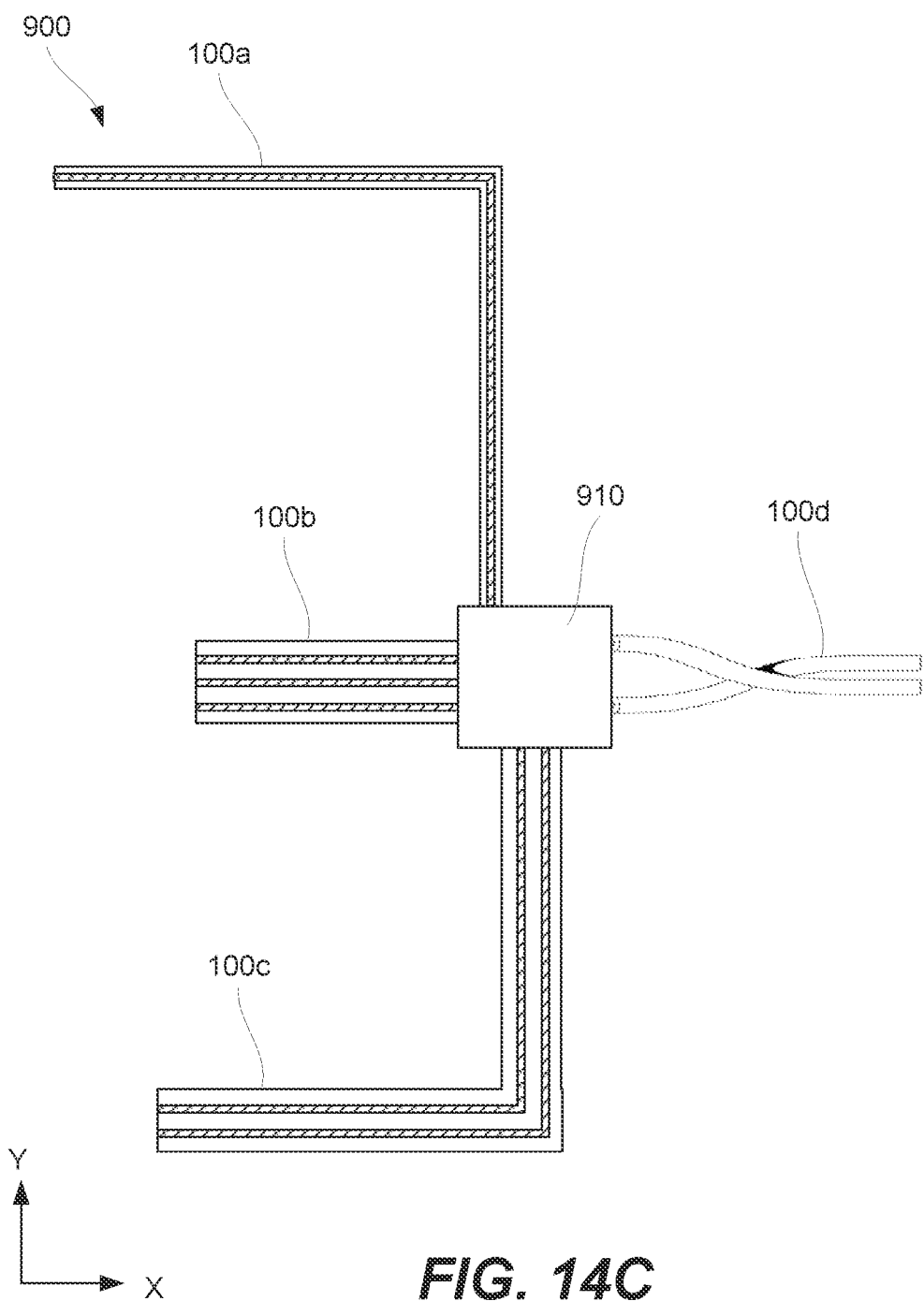
FIG. 14C illustrates of an example of an interconnect assembly comprising an interconnect hub connected to three flexible hybrid interconnect circuits and a conventional twisted pair cable.

While FIGS. 14A and 14B illustrate an example where connections between conductive elements of two interconnect circuits are simply flipped, one having ordinary skill in the art would understand that any other programmable connections are possible with this design. For example, conductive elements of the same interconnect circuit may be connected or disconnected, additional interconnect circuits may be connected to interconnect hub 910, and so on. For example, FIG. 14C illustrates an example of interconnect assembly 900 comprising interconnect hub 910, connected to flexible hybrid interconnect circuits 100a-100c and twisted pair cable 100d. It should be noted that interconnect circuits 100a-100c described above provide various advantages in signal transmission, in comparison to conventional twisted pair cables. In particular, an interconnect circuit has much better impedance control due to the fixed position between its conductive elements, while the distance between wires in a twisted pair cable can vary substantially.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present examples are to be considered as illustrative and not restrictive.

What is claimed is:

1. A flexible hybrid interconnect circuit, having a thickness, the flexible hybrid interconnect circuit comprising: a first outer dielectric; a second outer dielectric; an inner dielectric; a first conductive element; and a second conductive element, stacked with the first conductive element along the thickness of the flexible hybrid interconnect circuit and between the first outer dielectric and the second outer dielectric, wherein the inner dielectric is at least partially disposed between the first conductive element and the second conductive element providing support to the first conductive element and the second conductive element relative to each other, and wherein both of the first conductive element and the second conductive element extend out of a plane and through the inner dielectric forming a direct electrical connection between the first conductive element and the second conductive element.

2. The flexible hybrid interconnect circuit of claim 1, wherein only one of the first conductive element and the second conductive element extends out of the plane and through the inner dielectric forming the direct electrical connection between the first conductive element and the second conductive element.

3. The flexible hybrid interconnect circuit of claim 1, wherein the inner dielectric fills gaps around the direct electrical connection between the first conductive element and the second conductive element.

4. The flexible hybrid interconnect circuit of claim 1, wherein the direct electrical connection between the first conductive element and the second conductive element is formed by one or more of welding, soldering, mechanical crimping, and conductive adhesive bonding.

5. The flexible hybrid interconnect circuit of claim 1, wherein each of the first outer dielectric and the second outer dielectric continuously extend over the direct electrical connection between the first conductive element and the second conductive element.

6. The flexible hybrid interconnect circuit of claim 1, wherein the inner dielectric comprises a dielectric opening allowing the one or both of the first conductive element and the second conductive element extend through the inner dielectric forming the direct electrical connection between the first conductive element and the second conductive element.

7. The flexible hybrid interconnect circuit of claim 6, wherein the dielectric opening and the direct electrical connection between the first conductive element and the second conductive element are sealed from environment by the first outer dielectric and the second outer dielectric.

8. The flexible hybrid interconnect circuit of claim 1, further comprising an additional conductive element positioned between the first conductive element and the second conductive element and electrically insulated from the first conductive element and the second conductive element.

9. The flexible hybrid interconnect circuit of claim 1, wherein the first conductive element is substantially wider than the second conductive element such that edges of the first conductive element extend past edges of the second conductive element.

10. The flexible hybrid interconnect circuit of claim 9, wherein: the first conductive element is operable as a shield; the second conductive element is operable as a signal line configured to transmit an electromagnetic wave; and the first conductive element comprises a plurality of openings each having a size less than a wavelength of the electromagnetic wave transmitted by the second conductive element.

11. The flexible hybrid interconnect circuit of claim 1, wherein: the first conductive element comprises a first conductive element portion, a second conductive element portion, and a transition portion, disposed between and monolithic with each of the first conductive element portion and the second conductive element portion; and a width of the transition portion is less than a width of either the first conductive element portion or the second conductive element portion.

12. The flexible hybrid interconnect circuit of claim 11, wherein the width of the transition portion is 5% to 50% of the width of either the first conductive element portion or the second conductive element portion.

13. The flexible hybrid interconnect circuit of claim 11, wherein: the first conductive element portion, the transition portion, and the second conductive element portion extend along an axis; and the first conductive element portion is offset relative to the second conductive element portion in a direction perpendicular to this axis.

14. The flexible hybrid interconnect circuit of claim 1, wherein the inner dielectric comprises a crosslinked polyethylene (XLPE).

15. The flexible hybrid interconnect circuit of claim 1, wherein the inner dielectric has a dielectric constant less than 2.

16. The flexible hybrid interconnect circuit of claim 1, wherein the inner dielectric comprises a flame retardant.

17. The flexible hybrid interconnect circuit of claim 1, wherein the inner dielectric comprises a coefficient of thermal expansion (CTE)-matching additive such that a CTE of the inner dielectric substantially matches a CTE of each of the first conductive element and the second conductive element.

18. The flexible hybrid interconnect circuit of claim 1, wherein the inner dielectric has a uniform composition throughout an entire volume between the first outer dielectric and the second outer dielectric.

19. A flexible hybrid interconnect circuit, having a thickness, the flexible hybrid interconnect circuit comprising: a first outer dielectric; a second outer dielectric; an inner dielectric; a first conductive element; and a second conductive element, stacked with the first conductive element along the thickness of the flexible hybrid interconnect circuit and between the first outer dielectric and the second outer dielectric, wherein the inner dielectric is at least partially disposed between the first conductive element and the second conductive element providing support to the first conductive element and the second conductive element relative to each other, wherein one or both of the first conductive element and the second conductive element extend out of a plane and through the inner dielectric forming a direct electrical connection between the first conductive element and the second conductive element, and wherein the second conductive element wraps around edges of the inner dielectric and the first conductive element and directly interfaces and forms an electrical connection with the first conductive element.

\* \* \* \* \*